United States Patent
Yamano

(10) Patent No.: US 8,193,617 B2
(45) Date of Patent: Jun. 5, 2012

(54) SEMICONDUCTOR DEVICE AND MANUFACTURING METHOD THEREFOR

(75) Inventor: Takaharu Yamano, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 391 days.

(21) Appl. No.: 12/476,454

(22) Filed: Jun. 2, 2009

(65) Prior Publication Data

US 2009/0302471 A1 Dec. 10, 2009

(30) Foreign Application Priority Data

Jun. 5, 2008 (JP) .................. 2008-148592
Aug. 20, 2008 (JP) .................. 2008-211642
Dec. 11, 2008 (JP) .................. 2008-315512

(51) Int. Cl.
*H01L 23/552* (2006.01)
(52) U.S. Cl. ..................... 257/660; 438/612
(58) Field of Classification Search ............ 257/660, 257/297, E31.089; 438/612
See application file for complete search history.

(56) References Cited

U.S. PATENT DOCUMENTS

| 2004/0155323 A1* | 8/2004 | Murakami et al. ............ 257/676 |
| 2005/0146403 A1* | 7/2005 | Okubora ........................ 333/247 |
| 2008/0190658 A1* | 8/2008 | Toyoda et al. ................. 174/263 |

FOREIGN PATENT DOCUMENTS

| JP | 09-064069 | 3/1997 |
| JP | 09-064236 | 3/1997 |
| JP | 09-167784 | 6/1997 |
| JP | 2000-195891 | 7/2000 |
| JP | 2007-035758 | 2/2007 |
| JP | 2007-311828 | 11/2007 |

* cited by examiner

*Primary Examiner* — Michael Lebentritt
*Assistant Examiner* — Shaun Campbell
(74) *Attorney, Agent, or Firm* — Drinker Biddle & Reath LLP

(57) ABSTRACT

There is provided a semiconductor device including a semiconductor substrate on which a plurality of semiconductor chips having electrode pads is formed, an internal connection terminal provided on each of the electrode pads, an insulating layer provided to cover the plurality of semiconductor chips and the internal connection terminals, and a wiring pattern connected to the internal connection terminals across the insulating layer. This semiconductor device is characterized in that the insulating layer is configured to contain an alpha ray blocking material including polyimide and/or a polyimide-based compound.

13 Claims, 29 Drawing Sheets

SEMICONDUCTOR DEVICE AND MANUFACTURING METHOD THEREFOR

BACKGROUND OF THE INVENTION

The present invention relates to a semiconductor device and a manufacturing method therefor and, more particularly, to a semiconductor device, whose size in plan view is substantially equal to that of a semiconductor chip which is flip-chip-connected to a wiring pattern, and a manufacturing method therefor.

In recent years, reduction in size, thickness, and weight of semiconductor-applied products for use in mobile devices, such as digital cameras and portable telephones, has rapidly been progressed. Thus, e.g., miniaturization and density growth are required by semiconductor devices, such as NAND flash memories. A semiconductor device (see, e.g., FIG. 1) referred to as what is called a chip size package (CSP), whose size in plan view is set to be substantially equal to that of a semiconductor chip, has been proposed. Further, in addition to miniaturization and density growth, price-reduction is strongly required by such a semiconductor device.

Hereinafter, a semiconductor device and a manufacturing method therefor, which have hitherto been proposed, are described with reference to the accompanying drawings. FIG. 1 is a cross-sectional view exemplifying a conventional semiconductor device. Referring to FIG. 1, the conventional semiconductor device 100 has a semiconductor chip 101, internal connection terminals 102, an insulating layer 103, wiring patterns 104, a solder resist 106, and external connection terminals 107.

The semiconductor chip 101 has a laminated semiconductor substrate 109, a semiconductor integrated circuit 111, a plurality of electrode pads 112, and a protection film 113. The semiconductor substrate 109 is a substrate obtained by separating a laminated Si wafer into individual pieces.

The semiconductor integrated circuit 111 is provided on a front surface of the semiconductor substrate 109. The semiconductor integrated circuit 111 is constituted by a diffusion layer, an insulating layer, a via-hole, and wiring (not shown). A plurality of electrode pads 112 are provided on the semiconductor integrated circuit 111. The plurality of electrode pads 112 are electrically connected to the wiring provided in the semiconductor integrated circuit 111. The protection film 113 is provided on the semiconductor integrated circuit 111. The protection film 113 is a film for protecting the semiconductor integrated circuit 111.

The internal connection terminals 102 are provided on the electrical pads 112, respectively. The top portion of each internal connection terminal 102 is exposed from the insulating layer 103. The top portion of each internal connection terminal 102 is connected to the wiring patterns 104. The insulation layer 103 is provided to cover one side of the semiconductor chip 101, on which the internal connection terminal 102 is provided. For example, a cohesive sheet-like insulating resin (e.g., a non-conductive film (NCF) or the like) can be used as the material of the insulating layer 103. Generally, such an insulating resin is formed of an epoxy resin, a cyanate ester resin, or the like, and has milk-white or colorless transparency. This insulating resin transmits alpha (α) rays, visible light rays, and ultraviolet rays to the semiconductor integrated circuit 111 placed under the insulating layer 103.

The wiring patterns 104 are provided on the insulating layer 103. The wiring patterns 104 is connected to the internal connection terminals 102. Each wiring pattern 104 is connected to an associated one of the electrode pads 112 via an associated one of the internal connection terminals 102. Each wiring pattern 104 has an external connection terminal provision area 104A on which an external connection terminal 107 is provided. The solder resist 106 is provided on the insulating layer 103 so as to cover apart of each wiring pattern 104 other than associated one of the external connection terminal provision areas 104A.

Each external connection terminal 107 is provided on the external connection terminal provision area 104A of an associated one of the wiring patterns 104. The external connection terminal 107 is connected to each wiring pattern 104. For example, an alloy containing Pb, an alloy of Sn and Cu, an alloy of Sn and Ag, and an alloy of Sn, Ag, and Cu can be used as the materials of the external connection terminals 107.

FIG. 2 is a plan view exemplifying a semiconductor substrate on which the conventional semiconductor device is formed. In FIG. 2, reference numeral 110 designates a semiconductor substrate. Reference character C denotes a position (hereunder referred to as a cutting position C) at which a dicer cuts the semiconductor substrate 110. Referring to FIG. 2, the semiconductor substrate 110 has a plurality of semiconductor device formation areas A and a plurality of scribe areas B for separating the plurality of semiconductor device formation areas A. The plurality of semiconductor device formation areas A are areas on which semiconductor devices 100 are formed. The semiconductor substrate 110 is laminated and cut at the cutting positions C into semiconductor substrates 109 (see FIG. 1) described above.

FIGS. 3 to 11 are views exemplifying a process of the conventional semiconductor device. In FIGS. 3 to 11, sometimes, the same composing elements as the conventional semiconductor device 100, illustrated in FIG. 1, are designated with the same reference numeral. The description of such composing elements is omitted. In FIGS. 3 to 11, reference character A designates each of a plurality of semiconductor device formation areas (hereunder referred to as "semiconductor device formation areas A"). Reference character B designates each of a plurality of scribe areas (hereunder referred to as "scribe areas B") for separating the plurality of semiconductor device formation areas from one another. Reference character C designates each of positions (hereunder referred to as "cutting positions C") at which a dicing blade cuts the semiconductor substrate 110.

First, in a step illustrated in FIG. 3, a semiconductor chip 101 having a semiconductor integrated circuit 111, a plurality of electrode pads 112, and a protection film 113 is formed on a front side of a semiconductor substrate 110 which is not laminated yet. Subsequently, in a step illustrated in FIG. 4, internal connection terminals 102 are formed on the plurality of electrode pads 112, respectively. In this stage, there is variance in height among a plurality of internal connection terminals 102.

Subsequently, in a step illustrated in FIG. 5, a flat plate 115 is pressed against the plurality of internal connection terminals 102 to thereby uniformize the height thereof (i.e., leveling is performed thereon). Then, in a step illustrated in FIG. 6, an insulating layer 103 made of resin is formed to cover one side of the semiconductor chip 101, on which the internal connection terminals 102 are formed, and the internal connection terminals 102. For example, a cohesive sheet-like insulating resin (e.g., a non-conductive film (NCF) or the like) can be used as the material of the insulating layer 103. Generally, such an insulating resin is formed of an epoxy resin, a cyanate ester resin, or the like, and has milk-white or colorless transparency. This insulating resin transmits alpha rays, visible light rays, and ultraviolet rays to the semiconductor integrated circuit 111 placed under the insulating layer 103.

Subsequently, in a step illustrated in FIG. 7, the insulating layer 103 is polished until the top surface 102A of each of the internal connection terminals 102 is exposed from the insulating layer 103. Polishing is performed such that the top surface 103A of the insulating layer 103 is substantially flush with the top surface 102A of each of the internal connection terminals 102 at that time. Consequently, the top surface of a structure illustrated in FIG. 7 (more specifically, the top surface 103A of the insulating layer 103 and the top surfaces 102A of the internal connection terminals 102) becomes a flat surface.

Then, in a step illustrated in FIG. 8, a wiring pattern 104 is formed on the top surface of the structure illustrated in FIG. 7. More specifically, the wiring pattern 104 is formed as follows. That is, a metallic foil (not shown) is attached to the structure illustrated in FIG. 7. Subsequently, a resist (not shown) is coated over the metallic foil. Then, this resist is exposed and developed to thereby form a resist film (not shown) on the metallic foil coated on a part corresponding to an area on which the wiring pattern 104 is formed. Subsequently, the metallic foil is etched using the resist film as a mask. Thus, the wiring pattern 104 is formed (subtractive method). Then, the resist film is eliminated.

Subsequently, in a step illustrated in FIG. 9, a solder resist 106 is formed on the insulating layer 103 to cover a part of the wiring pattern 104, which is other than the external connection terminal provision area 104A. Then, in a step illustrated in FIG. 10, the semiconductor substrate 110 is polished from the rear side of the semiconductor substrate 110. Thus, the semiconductor substrate 110 is laminated. Subsequently, in a step illustrated in FIG. 11, an external connection terminal 107 is formed on the external connection terminal provision area 104A. For example, an alloy containing Pb, an alloy of Sn and Cu, an alloy of Sn and Ag, and an alloy of Sn, Ag, and Cu can be used as the materials of the external connection terminals 107. Then, a plurality of semiconductor devices 100 are manufactured (see, e.g., Patent Documents 1 and 2) by cutting the semiconductor substrate 110 at parts respectively corresponding to the cutting positions C.

[Patent Document 1] JP-A-9-64069
[Patent Document 2] JP-A-2007-311828

However, in the case of using an alloy containing Pb as the material of the external connection terminal 107, sometimes, alpha rays are generated from a radioactive material, such as uranium (U) and thorium (Th), contained in Pb. The generated alpha rays are transmitted by the insulating layer 103. Then, the alpha rays travel towards the semiconductor integrated circuit 111. Further, the alpha rays reach the semiconductor substrate 109. The alpha rays having reached the semiconductor substrate 109 act upon a Si wafer and the like, which constitute the semiconductor substrate 109. Thus, electron-hole pairs are generated. Consequently, in the case of using an alloy containing Pb as the material of the external connection terminal 107, the conventional semiconductor device and the manufacturing method therefor have a problem in occurrence of what is called a soft error that is a phenomenon in which information is rewritten due to electric charges stored in a memory cell.

Further, even in the case of using an alloy of Sn and Cu, and an alloy of Sn and Ag, which are Pb-free materials, as the material of the external connection terminal 107, it is often that Pb is contained as an impurity in tin oxide used as the material of Sn. Sometimes, alpha rays are generated, similarly to the case of using an alloy containing Pb as the material of the external connection terminal 107. The generated alpha rays are transmitted by the insulating layer 103. Then, the alpha rays travel towards the semiconductor integrated circuit 111. Further, the alpha rays reach the semiconductor substrate 109. The alpha rays having reached the semiconductor substrate 109 act upon a Si wafer and the like, which constitute the semiconductor substrate 109. Thus, electron-hole pairs are generated. Consequently, even in the case of using an alloy of Sn and Cu, and an alloy of Sn and Ag, which are Pb-free materials, the conventional semiconductor device and the manufacturing method therefor have a problem in occurrence of what is called a soft error that is a phenomenon in which information is rewritten due to electric charges stored in a memory cell.

Further, the insulating layer 103 contains an inorganic filler, e.g., spherical silica ($SiO_2$), in order to reduce the coefficient of thermal expansion. The inorganic filler contains an infinitesimal quantity of radioactive materials, such as uranium (U) and thorium (Th). Accordingly, sometimes, alpha rays are generated from a radioactive material, such as uranium (U) and thorium (Th), contained in Pb. The generated alpha rays are transmitted by the insulating layer 103. Then, the alpha rays travel towards the semiconductor integrated circuit 111. Further, the alpha rays reach the semiconductor substrate 109. The alpha rays having reached the semiconductor substrate 109 act upon a Si wafer and the like, which constitute the semiconductor substrate 109. Thus, electron-hole pairs are generated. Consequently, in the case of using such an insulating layer, the conventional semiconductor device and the manufacturing method therefor have a problem in occurrence of what is called a soft error that is a phenomenon in which information is rewritten due to electric charges stored in a memory cell.

Furthermore, the solder resist 106 contains an inorganic filler, e.g., spherical silica ($SiO_2$), in order to reduce the coefficient of thermal expansion, similarly to the insulating layer 103. Accordingly, in the case of employing the solder resist 106, the conventional semiconductor device and the manufacturing method therefor have a problem similar to that of the insulating layer 103.

SUMMARY OF THE INVENTION

Thus, the invention is accomplished in view of the aforementioned problems. An object of the invention is to provide a semiconductor device and a manufacturing method therefor, which can reduce soft errors.

To achieve the foregoing object of the invention, according to a first aspect of the invention, there is provided a semiconductor device including:

a semiconductor substrate on which a plurality of semiconductor chips having electrode pads are formed, an internal connection terminal provided on each of the electrode pads, an insulating layer provided to cover the plurality of semiconductor chips and the internal connection terminals, and a wiring pattern connected to the internal connection terminals across the insulating layer, wherein the insulating layer is constructed to contain an alpha ray blocking material including polyimide and/or a polyimide-based compound.

According to a second aspect of the invention, there is provided the semiconductor device according to the first aspect of the invention, wherein the insulating layer contains an inorganic filler, and an amount of the inorganic filler is adjusted such that an amount of alpha rays detected from the insulating layer is equal to or less than 0.0015 count/$cm^2 \cdot h$.

According to a third aspect of the invention, there is provided the semiconductor device according to the first or second aspect of the invention, wherein the insulating layer has a structure in which a plurality of layers are stacked, and at least one of the plurality of layers is constructed to contain polyimide and/or a polyimide-based compound.

According to a fourth aspect of the invention, there is provided the semiconductor device according to the third aspect of the invention, wherein an amount of polyimide and/or a polyimide-based compound contained in one of the plurality of layers, which is closest to the semiconductor substrate, is larger than an amount of polyimide and/or a polyimide-based compound contained in each of the others of the plurality of layers.

According to a fifth aspect of the invention, there is provided the semiconductor device according to the third or fourth aspect of the invention, wherein an amount of an inorganic filler contained in one of the plurality of layers, which is closest to the semiconductor substrate, is less than an amount of an inorganic filler contained in each of the others of the plurality of layers.

According to a sixth aspect of the invention, there is provided the semiconductor device according to the fifth aspect of the invention, wherein the one of the plurality of layers, which is closest to the semiconductor substrate, contains no inorganic filler.

According to a seventh aspect of the invention, there is provided the semiconductor device according to any one of the first to the sixth aspects of the invention, wherein the insulating layer contains a material blocking visible light and ultraviolet light.

According to an eighth aspect of the invention, there is provided the semiconductor device according to the seventh aspect of the invention, wherein the material blocking visible light and ultraviolet light is a black-based material.

According to a ninth aspect of the invention, there is provided the semiconductor device according to the eighth aspect of the invention, wherein the black-based material is carbon black.

According to a tenth aspect of the invention, there is provided the semiconductor device according to the eighth aspect of the invention, wherein the black-based material is an organic pigment.

According to an eleventh aspect of the invention, there is provided the semiconductor device according to any one of the first to tenth aspects of the invention, wherein an amount of each of ionic impurities $Cl^-$ and $Na^+$ contained in the insulating layer is 10 part per million (ppm) or less.

According to a twelfth aspect of the invention, there is provided the semiconductor device according to any one of the first to eleventh aspects of the invention, wherein an amount of an ionic impurity $NH_4^+$ contained in the insulating layer is 50 ppm or less.

According to a thirteenth aspect of the invention, there is provided the semiconductor device according to any one of the first to twelfth aspects of the invention, wherein the wiring pattern includes a structure in which a titanium film and a copper film are stacked.

According to a fourteenth aspect of the invention, there is provided the semiconductor device according to the thirteenth aspect of the invention, wherein the titanium film is metal-joined with the copper film and the internal connection terminal.

According to a fifteenth aspect of the invention, there is provided the semiconductor device according to any one of the first to fourteenth aspects of the invention, wherein a surface of the insulating layer is roughened.

According to a sixteenth aspect of the invention, there is provided the semiconductor device according to any one of the first to fifteenth aspects of the invention, wherein a solder resist layer is formed on the insulating layer to cover the wiring pattern, and the solder resist layer contains no inorganic filler.

According to a seventeenth aspect of the invention, there is provided the semiconductor device according to any one of the first to sixteenth aspects of the invention, wherein the solder resist layer has an opening into which the wiring pattern is exposed, an external connection terminal is formed on the wiring pattern to be exposed into the opening portion, and a material of the external connection terminal does not contain Pb.

According to an eighteenth aspect of the invention, there is provided a manufacturing method for a semiconductor device, including:

a first step of forming an internal connection terminal on each of electrode pads of a semiconductor substrate on which a plurality of semiconductor chips having the electrode pads are formed, a second step of forming an insulating layer, which is constructed to contain an alpha ray blocking material, so as to cover the internal connection terminal, a third step of exposing a part of the internal connection terminal onto a top surface of the insulating layer and roughing a surface of the insulating layer, a fourth step of forming an electrically conductive layer on each of the top surface of the insulating layer and the exposed part of the internal connection terminal, a fifth step of forming a wiring layer on the electrically conductive layer, and a sixth step of forming a wiring pattern to be connected to the internal connection terminal by patterning the electrically conductive layer and the wiring layer.

According to a nineteenth aspect of the invention, there is provided the manufacturing method for a semiconductor according to the eighteenth aspect of the invention, wherein in the third step, a part of the internal connection terminal is exposed onto the top surface of the insulating layer by plasma ashing, and in addition, the surface of the insulating layer is roughened.

According to a twentieth aspect of the invention, there is provided the manufacturing method for a semiconductor according to the eighteenth or nineteenth aspect of the invention, wherein in the fourth step, the electrically conductive layer is formed by stacking a titanium film and a copper film in this order on the top surface of the insulating layer and the exposed part of the internal connection terminal by a vapor deposition method.

According to a twenty-first aspect of the invention, there is provided the manufacturing method for a semiconductor according to the twentieth aspect of the invention, wherein the vapor deposition method in the fourth step is a physical vapor deposition method.

According to a twenty-second aspect of the invention, there is provided the manufacturing method for a semiconductor according to any one of the eighteenth to twenty-first aspects of the invention, wherein in the fifth step, the wiring layer is formed by an electrolytic plating method using the electrically conductive layer as an electric supply layer.

According to a twenty-third aspect of the invention, there is provided the manufacturing method for a semiconductor according to any one of the eighteenth to twenty-second aspects of the invention, wherein in the first step, the internal connection terminal is formed by a bonding wire.

According to the invention, a semiconductor device and a manufacturing method therefor, which are enabled to reduce soft errors, can be provided.

DETAILED DESCRIPTION OF THE PREFERRED EMBODIMENTS

Hereinafter, a best mode for carrying out the invention is described with reference to the accompanying drawings.

First Embodiment

Figure 1:
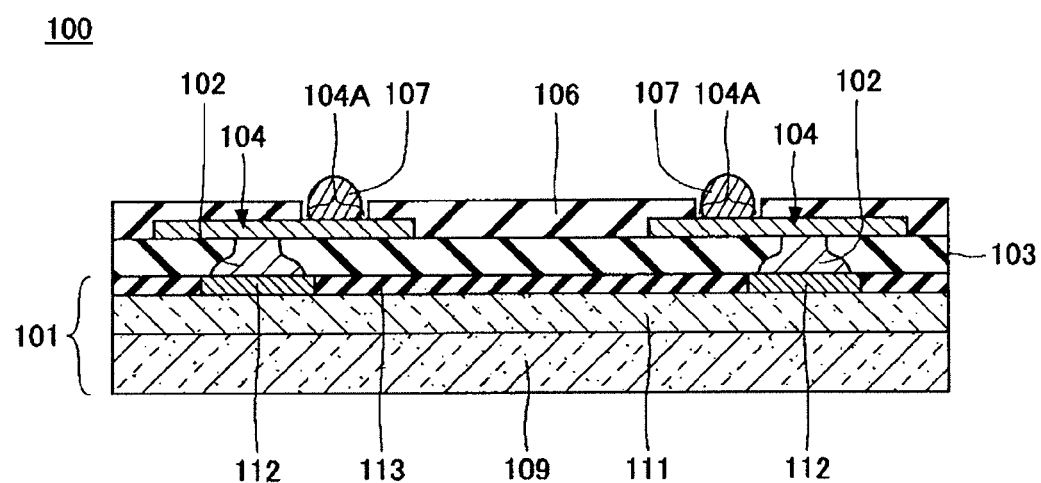
FIG. 1 is a cross-sectional view exemplifying a conventional semiconductor device.
Figure 2:
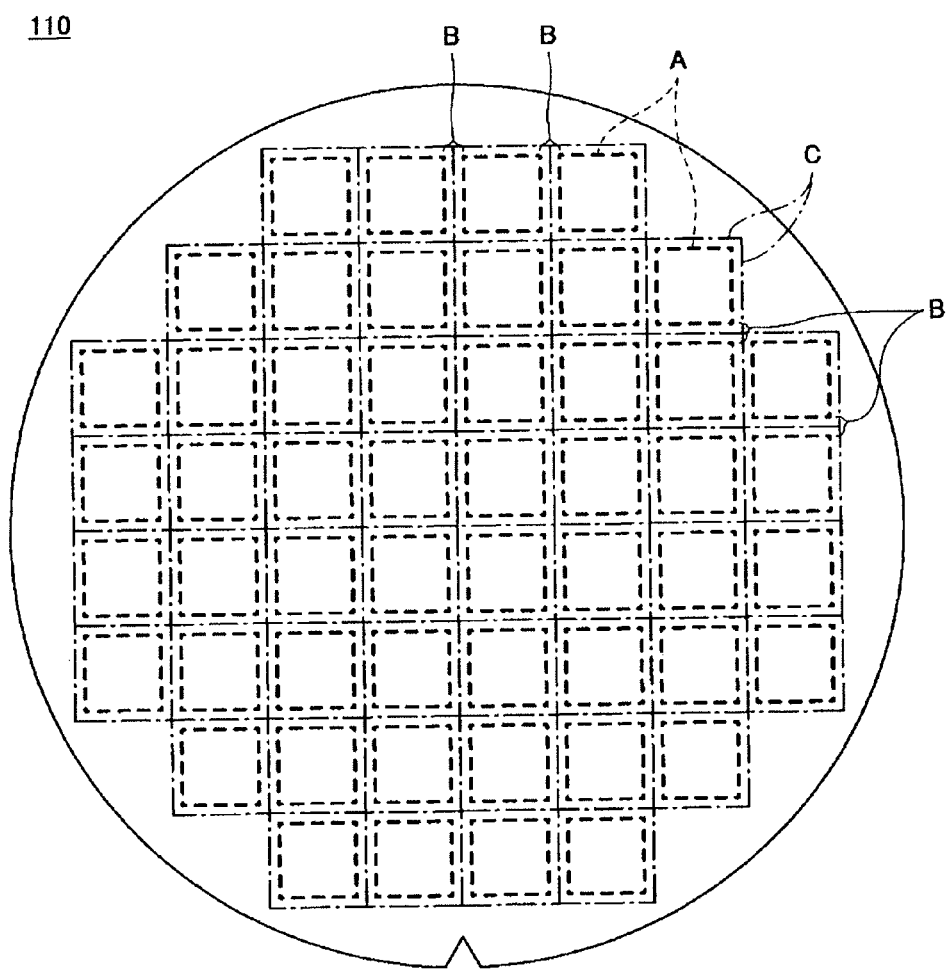
FIG. 2 is a plan view exemplifying a semiconductor substrate on which the conventional semiconductor device is formed.
Figure 3:
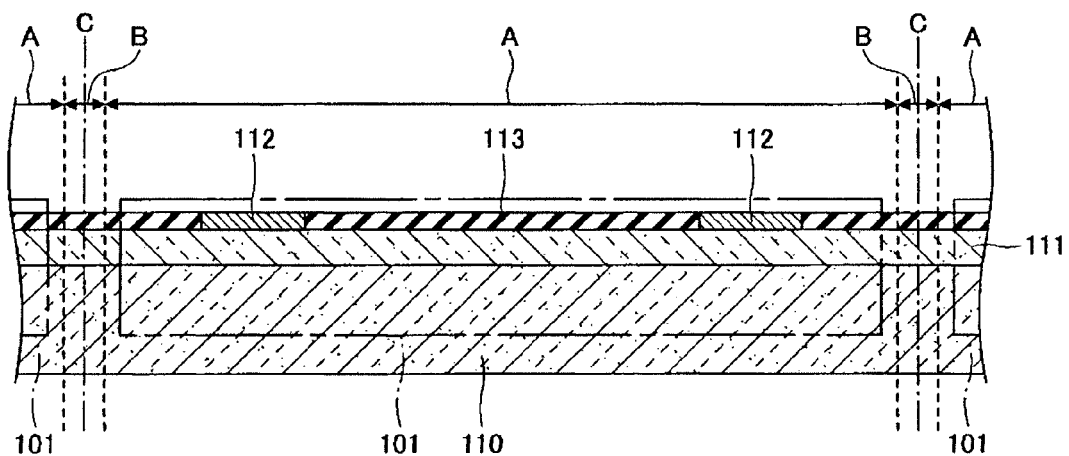
FIG. 3 is a view (No. 1) exemplifying a manufacturing process for the conventional semiconductor device
Figure 4:
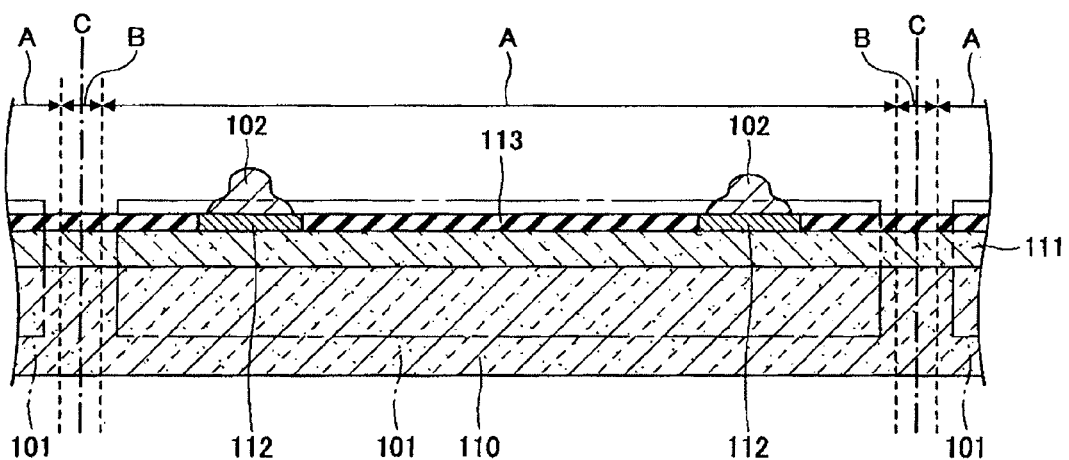
FIG. 4 is a view (No. 2) exemplifying the manufacturing process for the conventional semiconductor device.
Figure 5:
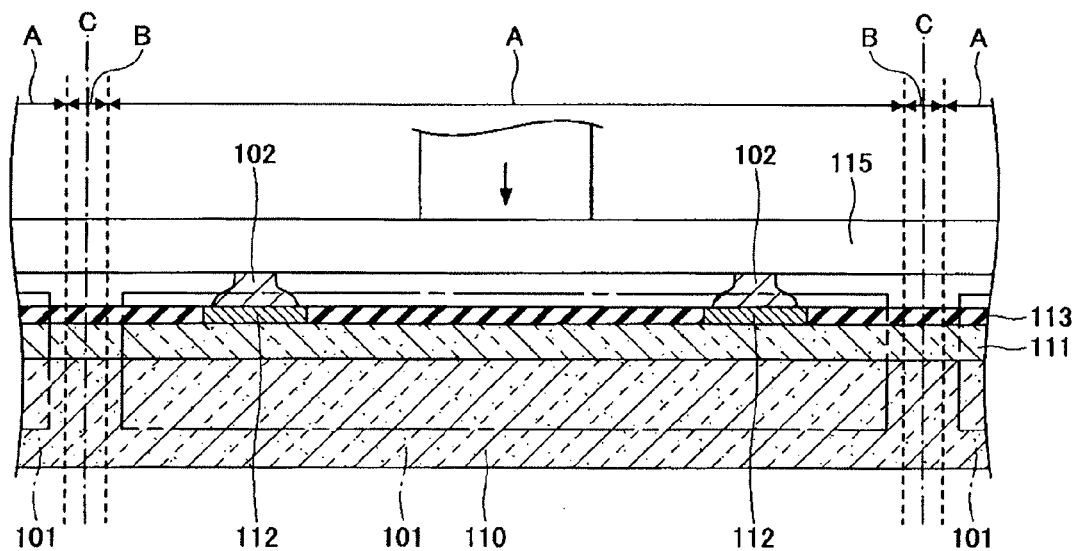
FIG. 5 is a view (No. 3) exemplifying the manufacturing process for the conventional semiconductor device.
Figure 6:
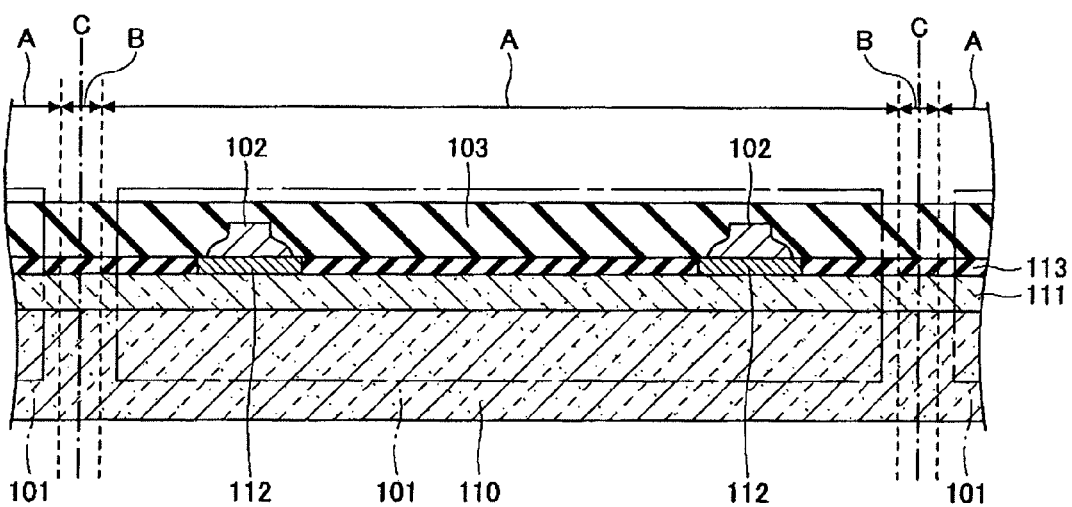
FIG. 6 is a view (No. 4) exemplifying the manufacturing process for the conventional semiconductor device.
Figure 7:
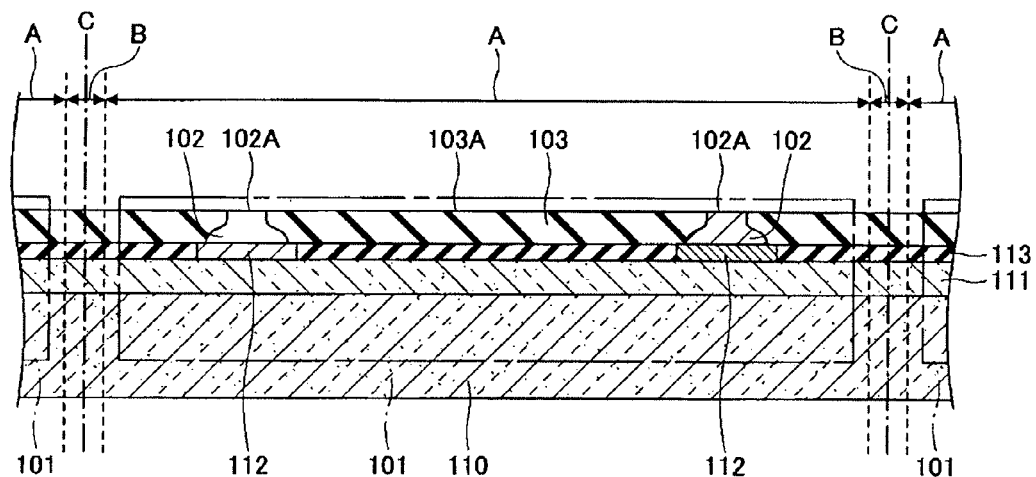
FIG. 7 is a view (No. 5) exemplifying the manufacturing process for the conventional semiconductor device.
Figure 8:
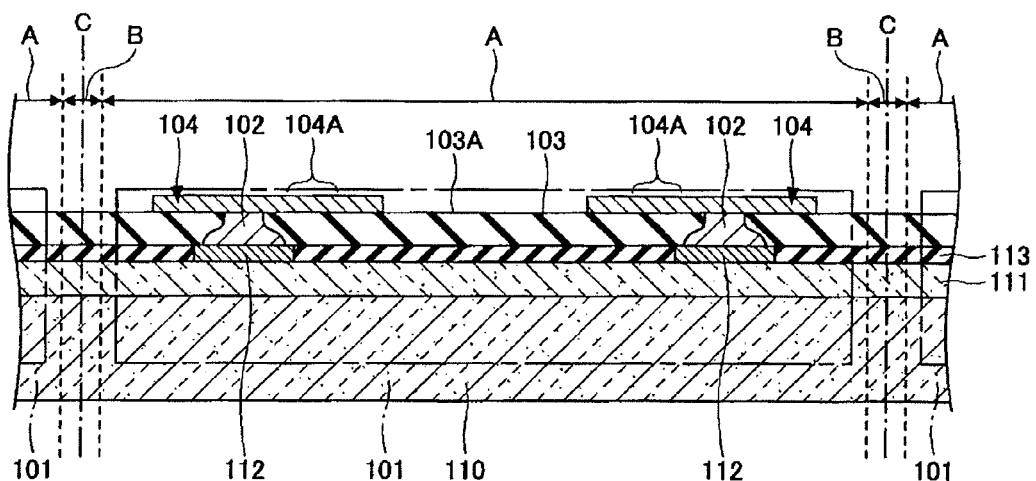
FIG. 8 is a view (No. 6) exemplifying the manufacturing process for the conventional semiconductor device.
Figure 9:
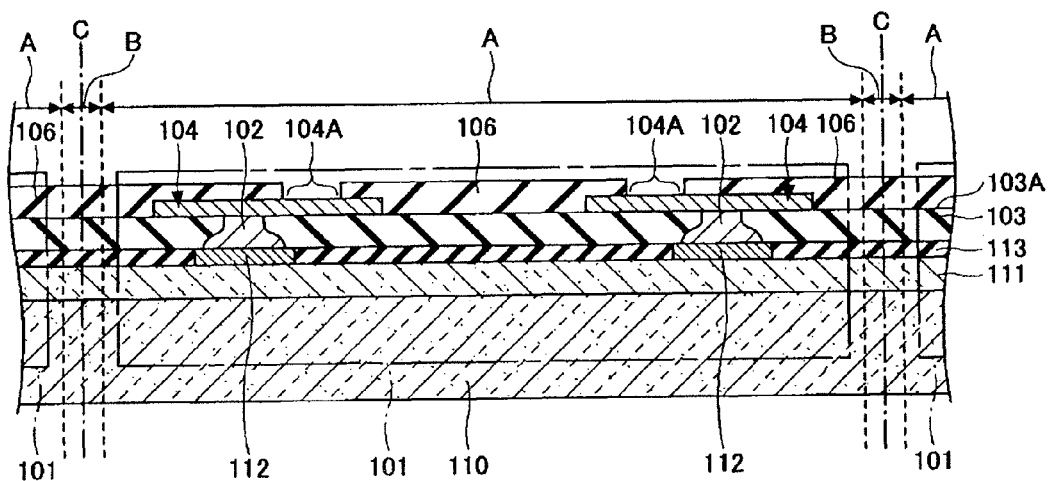
FIG. 9 is a view (No. 7) exemplifying the manufacturing process for the conventional semiconductor device.
Figure 10:
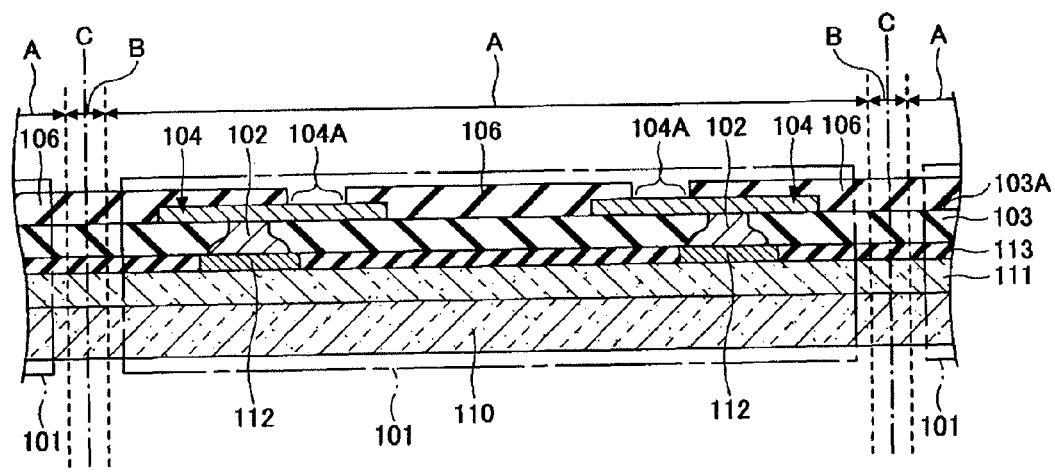
FIG. 10 is a view (No. 8) exemplifying the manufacturing process for the conventional semiconductor device.
Figure 11:
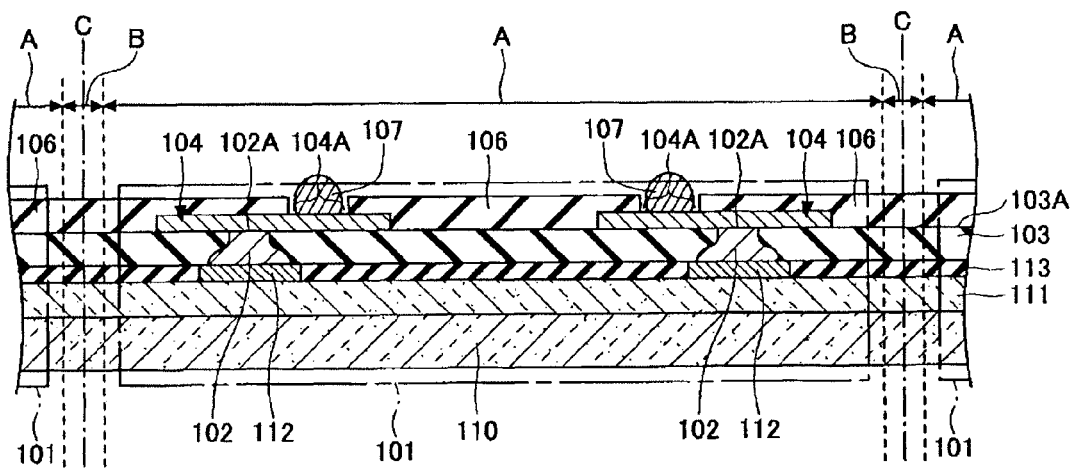
FIG. 11 is a view (No. 9) exemplifying the manufacturing process for the conventional semiconductor device.
Figure 12:
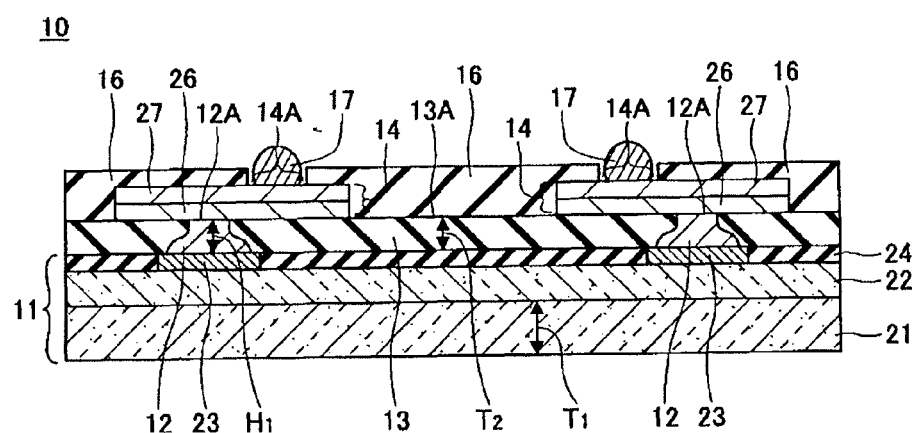
FIG. 12 is a cross-sectional view exemplifying a semiconductor device according to a first embodiment of the invention.

FIG. 12 is a cross-sectional view exemplifying a semiconductor device according to a first embodiment of the invention. Referring to FIG. 12, a semiconductor device 10 includes a semiconductor chip 11, internal connection terminals 12, an insulating layer 13, wiring patterns 14 including a first metal layer 26 and a second metal layer 27, solder resists 16, and external connection terminals 17.

Figure 13:
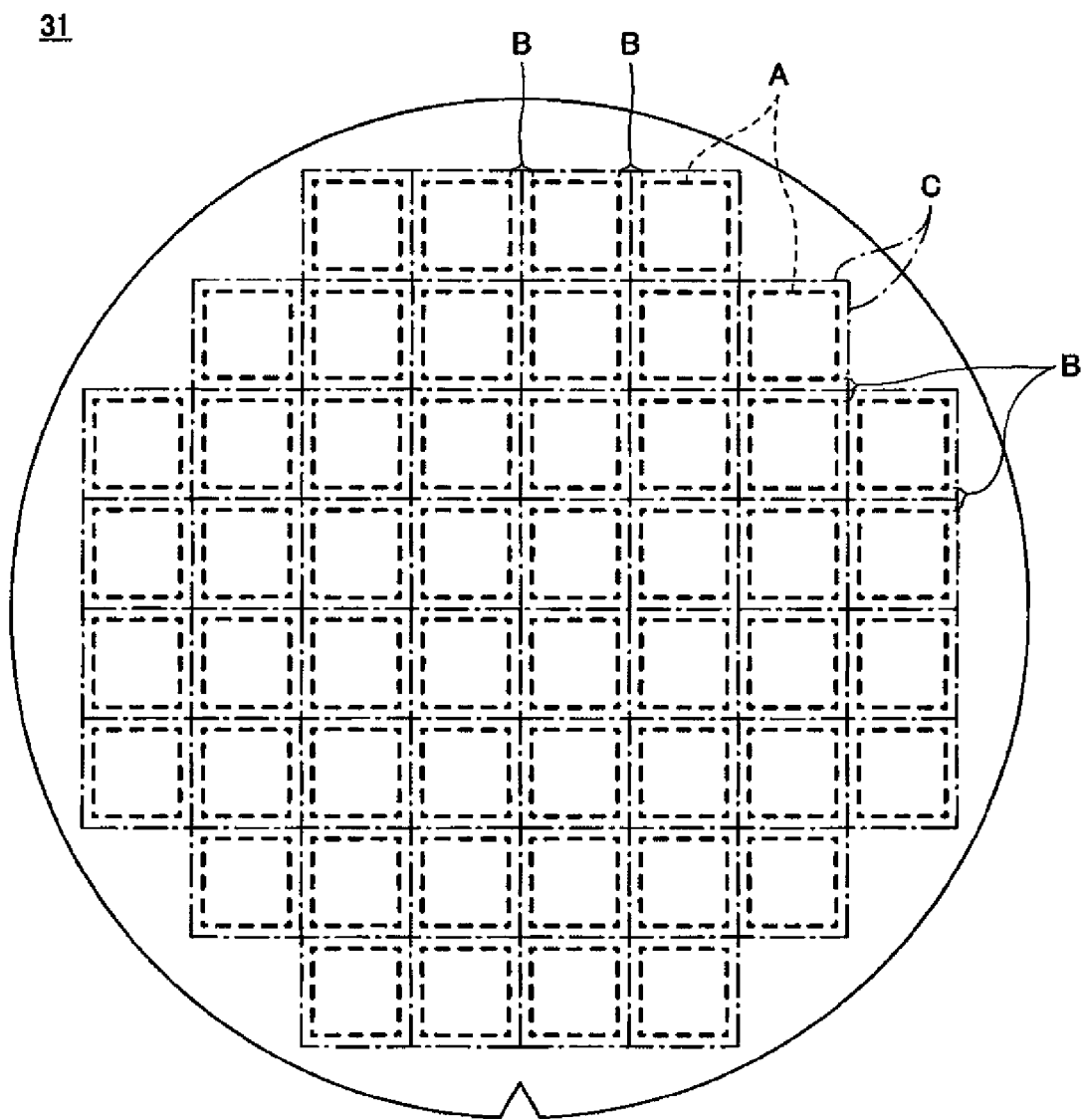
FIG. 13 is a plan view exemplifying a semiconductor substrate on which the semiconductor device according to the first embodiment of the invention is formed.

FIG. 13 is a plan view illustrating a semiconductor substrate on which the semiconductor device according to the first embodiment of the invention is formed. In FIG. 13, reference numeral 31 designates a semiconductor substrate. Reference character C denotes a position (hereunder referred to as a cutting position C) at which a dicer cuts the semiconductor substrate 31. The semiconductor substrate 31 has a plurality of semiconductor device formation areas A and a plurality of scribe areas B, including the cutting position C, for separating the plurality of semiconductor device formation areas A. The plurality of semiconductor device formation areas A are areas on which semiconductor devices 10 are formed. The semiconductor substrate 31 is a substrate which is laminated and cut at the cutting positions C to thereby form semiconductor substrates 21 illustrated in FIG. 12.

As illustrated in FIG. 12, the semiconductor chip 11 has a semiconductor substrate 21, a semiconductor integrated circuit 22, a plurality of electrode pads 23, and a protection film 24. The semiconductor substrate 21 is a substrate for forming a semiconductor integrated circuit 22. The semiconductor substrate 21 is laminated. The thickness $T_1$ of the semiconductor substrate 21 can be set at 50 μm to 500 μm. The semiconductor substrate 21 is a substrate obtained by separating a laminated Si wafer into individual pieces.

A semiconductor integrated circuit 22 is provided on a front surface side of the semiconductor substrate 21. The semiconductor integrated circuit 22 includes a diffusion layer (not shown) formed on the semiconductor substrate 21, an insulating layer (not shown) stacked on the semiconductor substrate 21, a via-hole (not shown) provided in the insulating layer stacked thereon, and wiring or the like (not shown).

A plurality of electrode pads 23 are provided on the semiconductor integrated circuit 22. The electrode pads 23 are electrically connected to the wiring (not shown) formed on the semiconductor integrated circuit 22. For example, Al or the like can be used as the material of the electrode pads 23. A material obtained by forming an Al-layer on a Cu-layer, or that obtained by further forming an Al-layer on a Si-layer formed on a Cu-layer can be used as that of the electrode pads 23.

The protection film 24 is provided on the semiconductor integrated circuit 22. The protection film 24 is a film for protecting the semiconductor integrated circuit 22, and is sometimes referred to as a passivation film. For example, a silicon nitride (SiN) film and a phosphosilicate glass (PSG) film can be used as the protection film 24. Alternatively, a layer made of polyimide can be stacked on a layer formed of a SiN film, a PSG film or the like.

The internal connection terminal 12 is provided on the electrode pads 23. The internal connection terminal 12 is used to electrically connect the semiconductor integrated circuit 22 to the wiring pattern 14. The height $H_1$ of the internal connection terminal 12 can be set at 10 micro-meters (μm) to 60 μm. For example, a gold (Au) bump, copper (Cu) bump, Au-plating-film, a metal film including a Ni-film, which is formed by a nonelectrolytic plating method, and an Au-film covering the Ni-film, or the like can be used as the internal connection terminal 12. Au-bumps or Cu-bumps can be formed by a bonding wire using a wire bonding apparatus. Alternatively, Au-bumps or Cu-bumps can be formed by a plating method.

The insulating layer 13 seals and protects a circuit formation surface (main surface) of the semiconductor chip 11. In addition, the insulating layer 13 serves as a base material for forming the wiring pattern 14. The insulating layer 13 is provided to cover the internal connection terminal 12, which is other than the top surface 12A thereof, and the semiconductor chip 11. The top surface 12A of the internal connection terminal 12 is exposed from the insulating layer 13. The top surface 13A of the insulating layer 13 is set to be substantially flush with the top surface 12A of the internal connection terminal 12.

The insulating layer 13 is constructed to contain the alpha ray blocking material. The purpose of this material is to block alpha rays. Thus, as long as the material can block alpha rays, any material can be contained in the insulating layer 13. The insulating layer 13 can effectively block alpha rays by being constructed to contain, e.g., polyimide and/or a polyimide-based compound such as modified polyimide.

Further, an insulating resin or the like tinged with a black-based color by containing, e.g., a black-based material, such as carbon black, and a black-based organic pigment or the like, in addition to the material, such as modified polyimide, which blocks alpha rays, can be used as the material of the insulating layer 13. The term "insulating resin or the like" designates a resin that exhibits an insulation property at least in a horizontal direction.

The insulating layer 13 tinged with a black-based color by containing, e.g., a black-based material, such as carbon black, and a black-based organic pigment or the like, in addition to the alpha ray blocking material, such as modified polyimide, has the property of blocking alpha rays and has also the property of blocking visible light rays and ultraviolet light rays. A malfunction of the semiconductor device 10 can be prevented from being caused due to a photoeletromotive force generated by irradiating visible light or ultraviolet light thereonto. To cite an example, in a case where the thickness of the insulating layer 13 is 30 μm and where an additive amount of carbon black ranges from 0.5 weight percent (wt %) to 1.0 wt %, the insulating layer 13 can block visible light rays and ultraviolet light rays.

Examples of an insulating resin, which can be used in the device according to the invention, are described below. That is, a cohesive sheet-like insulating resin (e.g., NCF (non-conductive film)) put in a B-stage state (semi-cured state), a paste-like sheet-like insulating resin (e.g., NCP (non-conductive paste)), a cohesive sheet-like anisotropic electrically conductive resin (e.g., ACF (anisotropic conductive film)), a paste-like anisotropic electrically conductive resin (e.g., ACP (anisotropic conductive paste)), a build-up resin (epoxy resin containing an inorganic filler, or an epoxy resin containing no inorganic filler), and a liquid crystal polymer can be cited as the examples of such an insulating resin. The ACP and the ACF are obtained by dispersing small-diameter-sphere-like resins coated with Ni/Au in an insulating resin using an epoxy resin or a cyanate ester resin as a base material. The ACP and the ACF are resins that exhibit electrical conductivity in a vertical direction and an insulation property in a horizontal direction.

Incidentally, the term "carbon black" designates an aggregate of crystallites produced by burning or pyrolytically decomposing carbon hydride or a compound containing carbon in a state in which air is insufficiently supplied thereto. For example, channel black, roller black, oil furnace black, gas furnace black, acetylene black, fine thermal black, medium thermal black, lamp black, bone black, soot of burnt pine, lamp soot, vegetable black, and the like can be cited as carbon black. When carbon black is added to the insulating resin or the like, carbon black is used in a powdered state, a slurry state, or a paste-like state.

Incidentally, an organic pigment is a generic term for pigments made of organic dyes. As compared with inorganic pigments, generally, the organic pigments are high in tinting strength, and are rich in hue. Pigments having various chemical structures, e.g., an azo pigment, and an anthraquinone-based pigment, are known as organic pigments. However, preferably, according to the invention, a black-based organic pigment is used.

The insulating layer 13 contains an inorganic filler, e.g., spherical silica (SiO$_2$), in order to reduce the coefficient of thermal expansion. The inorganic filler contains an infinitesimal quantity of radioactive materials, such as uranium (U) and thorium (Th). Accordingly, sometimes, alpha rays are generated from a radioactive material, such as uranium (U) and thorium (Th), contained in the inorganic filler.

Preferably, an amount of alpha rays detected from the insulating layer 13 is equal to or less than 0.0015 count/cm$^2$·h. This is because of the facts that an amount of radioactive materials, which emit alpha rays and are contained in the insulating layer 13, is large even when amounts of alpha rays, visible light rays, and ultraviolet light rays irradiated from the outside of the insulating layer 13 (i.e., from the side of the external connection terminal 17) are reduced, and that the insulating layer 13 itself generates alpha rays, so that the rate of occurrence of what is called a soft error cannot be reduced. Incidentally, the amount of alpha rays detected from the insulating layer 13 has a value obtained by measuring an amount of alpha rays emitted from the insulating layer 13. The amount of alpha rays detected from the insulating layer 13 can be set to be equal to or less than 0.0015 count/cm$^2$·h by adjusting an amount of inorganic filler contained in the insulating layer 13.

It is empirically known that when an amount of alpha rays detected from the insulating layer 13 is equal to or less than 0.0015 count/cm$^2$·h, the rate of occurrence of what is called a soft error due to the alpha rays is extremely low. The thickness $T_2$ of the insulating layer 13 can be set to range from 10 μm to 60 μm.

Preferably, an amount of each of ionic impurities Cl$^-$ and Na$^+$ contained in the insulating layer 13 is equal to or less than 10 ppm. Further, preferably, an amount of an ionic impurity NH$_4^+$ contained in the insulating layer 13 is equal to or less than 50 ppm. This is a countermeasure against the corrosion of the electrode pads 23 made of, e.g., Al. Incidentally, an amount of ionic impurities can be measured by extracting the ionic impurities using hot water (e.g., at 121° C./20 hours) and then analyzing the extracted impurities by an ion chromatography method.

Thus, the insulating layer 13 can be configured such that alpha rays, visible light rays, and ultraviolet light rays irradiated from the outside of the insulating layer 13 (i.e., from the side of the external connection terminal 17) are blocked, and that an amount of alpha rays generated from the insulating layer 13 itself is reduced.

Incidentally, there is a case where a layer made of polyimide is further stacked on the protection film 24. In this case, the polyimide layer stacked on the protection film 24 has an advantage in blocking alpha rays. According to the invention, even in a case where no polyimide layer is further stacked on the protection film 24, alpha rays can be blocked by the insulating layer 13.

The wiring pattern 14 is sometimes referred to also as what is called a "rewiring wire" and is provided in order to differentiate the positions of the electrode pads 23 from the positions of the external connection terminals 17 (i.e., in order to place the terminals to fan-in positions and optional positions and in order to perform what is called pitch conversion). The wiring pattern 14 includes a first metal layer 26 and a second metal layer 27. Further, the first metal layer 26 is a structure in which a Ti-film and a Cu-film are stacked, a structure in which a Cr-film and a Cu-film are stacked, or a single-layer structure formed of a Cu-film. For example, Cu or the like can be used as the material of the second metal layer 27.

The wiring pattern 14 is provided on the top surface 13A of the insulating layer 13 so as to be contacted with the top surface 12A of the internal connection terminal 12. The wiring pattern 14 is electrically connected to the semiconductor integrated circuit 22 via the internal connection terminal 12. The wiring pattern 14 has an external connection terminal provision area 14A on which the external connection terminal 17 is provided. The thickness of the wiring pattern 14 can be set to range from 5 μm to 20 μm.

In a case where the first metal layer 26 is set as a structure in which a Ti-film and a Cu-film are stacked, or a structure in which a Cr-film and a Cu-film are stacked, the top surface 12A of the internal connection terminal 12 exposed from the top surface 13A of the insulating layer 13 is metal-joined with the Ti-film or the Cr-film constituting the first metal layer 26. In a case where the first metal layer 26 is set as a single-layer structure formed of a Cu-film, the top surface 12A of the internal connection terminal 12 exposed from the top surface 13A of the insulating layer 13 is metal-joined with the Cu-film constituting the first metal layer 26.

Further, in a case where the first metal layer 26 is set to be a structure in which a Ti-film and a Cu-film are stacked, or a structure in which a Cr-film and a Cu-film are stacked, the Ti-film or the Cr-film constituting the first metal layer 26 is metal-joined with the Cu-film constituting the first metal layer 26. The top surface 12A of the internal connection terminal 12 can be strongly joined with the first metal layer 26 by forming a metal joint therebetween. The reliability of the mechanical and electrical connection therebetween can be enhanced.

The solder resist 16 is provided to open the external connection terminal provision area 14A (either a solder mask defined (SMD) structure or a non-solder mask defined (NSMD) structure can be implemented) and to cover the wiring pattern 14. When the solder resist 16 contains inorganic filler, the solder resist 16 can serve as a generation source of alpha rays because the inorganic filler contains an infinitesimal quantity of radioactive materials, such as uranium (U) and thorium (Th).

Thus, the semiconductor device 10 according to the first embodiment of the invention employs a solder resist 16 that contains no inorganic filler (i.e., a filler-less solder resist 16). Consequently, the amount of alpha rays generated by the solder resist 16 can be infinitely decreased to zero. For example, resins, which contain no inorganic filler and contain epoxy, epoxy acrylate, cyanate ester, or siloxane as a major ingredient, can be used as the material of the solder resist 16.

The external connection terminal 17 is provided on the external connection terminal provision area 14A of the wiring pattern 14. The external connection terminal 17 is a terminal electrically connected to the pad provided on a mounting board (not shown) such as a mother board. For example, solder bumps or the like can be used as the external connection terminals 17. For example, an alloy containing Pb, an alloy of Sn and Cu, an alloy of Sn and Ag, an alloy of Sn, Ag, and Cu, and the like can be used. Alternatively, a solder ball (Sn-3.5Ag) or the like, which employs a resin (e.g., divinylbenzen) as a core, can be used as the material of the external connection terminal 17.

Incidentally, preferably, Pb-free solder, e.g., Sn-3.5Ag, or Sn-3.0Ag-0.5Cu is used as the material of the external connection terminal 17. This is because the amount of alpha rays reaching the semiconductor substrate 21 can drastically be reduced by the synergy effects of the insulating layer 13, which is constructed by containing the alpha ray blocking material, e.g., modified polyimide and adjusting the amount of inorganic filler such that the amount of alpha rays detected therefrom is equal to or less than 0.0015 count/cm$^2$·h, the solder resist 16 which contains no inorganic filler (i.e., is filler-less), and the external connection terminal 17 using Pb-free solder.

FIGS. 14 to 28 exemplify a manufacturing process for the semiconductor device according to the first embodiment of the invention. In FIGS. 14 to 28, the same composing part as that of the semiconductor device 10 illustrated in FIG. 12 is designated with the same reference numeral. Thus, sometimes, the description of such a composing part is omitted. In FIGS. 14 to 28, reference character C denotes a position (hereunder referred to as a "reference cutting position C") at which the semiconductor substrate 31 is cut by a dicing blade. Reference character A designates a plurality of semiconductor device formation areas (hereunder referred to as a "semiconductor device formation areas A"). Reference character B designates scribe areas (hereunder referred to as "scribe areas B"), which include the substrate cutting positions C, for separating the plurality of semiconductor device formation areas A.

Figure 14:
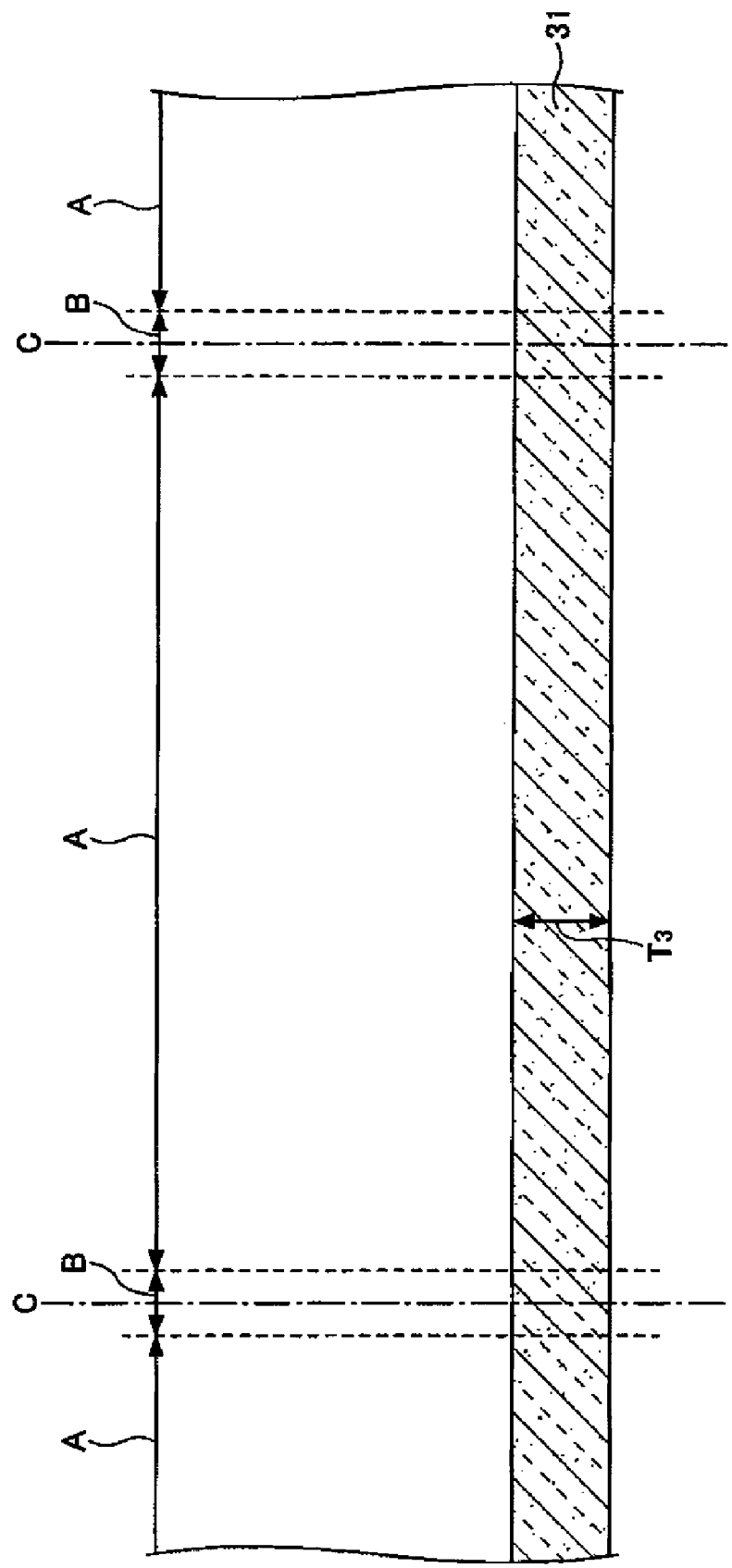
FIG. 14 is a view (No. 1) exemplifying a manufacturing process for a semiconductor device according to a first embodiment of the invention.

First, in a step illustrated in FIG. 14, the semiconductor substrate 31 is prepared (see FIG. 13), which has the plurality of semiconductor device formation areas A and the scribe areas B including the substrate cutting positions C for separating the plurality of semiconductor device formation areas A. The semiconductor substrate 31 is laminated and cut at the substrate cutting positions C into semiconductor substrates 21 (see FIG. 12) described above. For example, a Si wafer or the like can be used as the semiconductor substrate 31. The thickness $T_3$ of the semiconductor substrate 31 can be set to range from, e.g., 500 μm to 775 μm.

Figure 15:
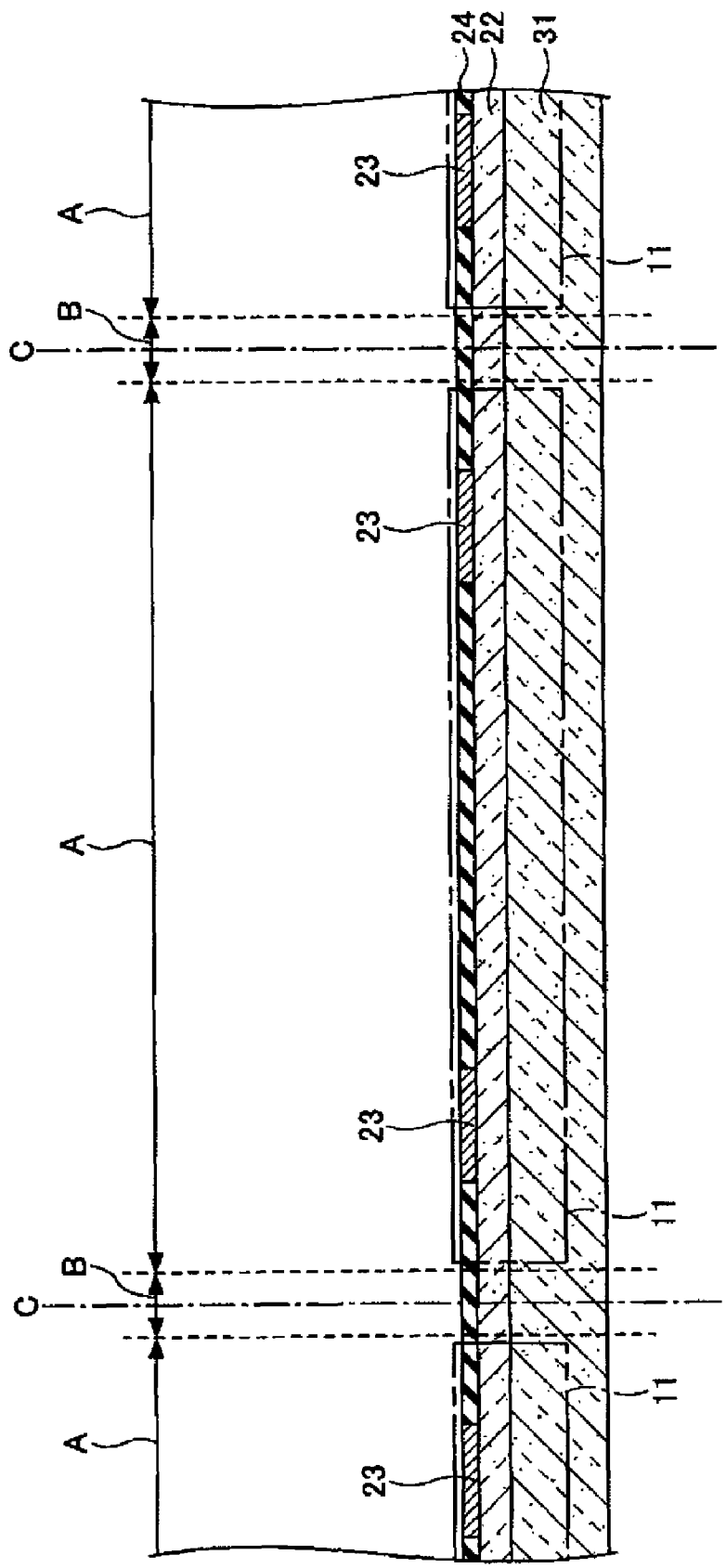
FIG. 15 is a view (No. 2) exemplifying the manufacturing process for the semiconductor device according to the first embodiment of the invention.

Subsequently, in a step illustrated in FIG. 15, semiconductor chips 11 each having a semiconductor integrated circuit 22, electrode pads 23, a protection film 24 are formed by known techniques on a front surface side of the semiconductor substrate 31, which corresponds to each of the semiconductor device formation areas A. For example, Al or the like can be used as the material of the electrode pads 23. A material obtained by forming an Al-layer on a Cu-layer, and a material obtained by forming a Si-layer on a Cu-layer and further forming an Al-layer on the Si-layer, and the like can be used as the material of the electrode pads 23. For example, a SiN film and a PSG film can be used as the protection film 24. In addition, a layer made of polyimide can be further stacked on a layer formed of a SiN film or a PSG film.

Figure 16:
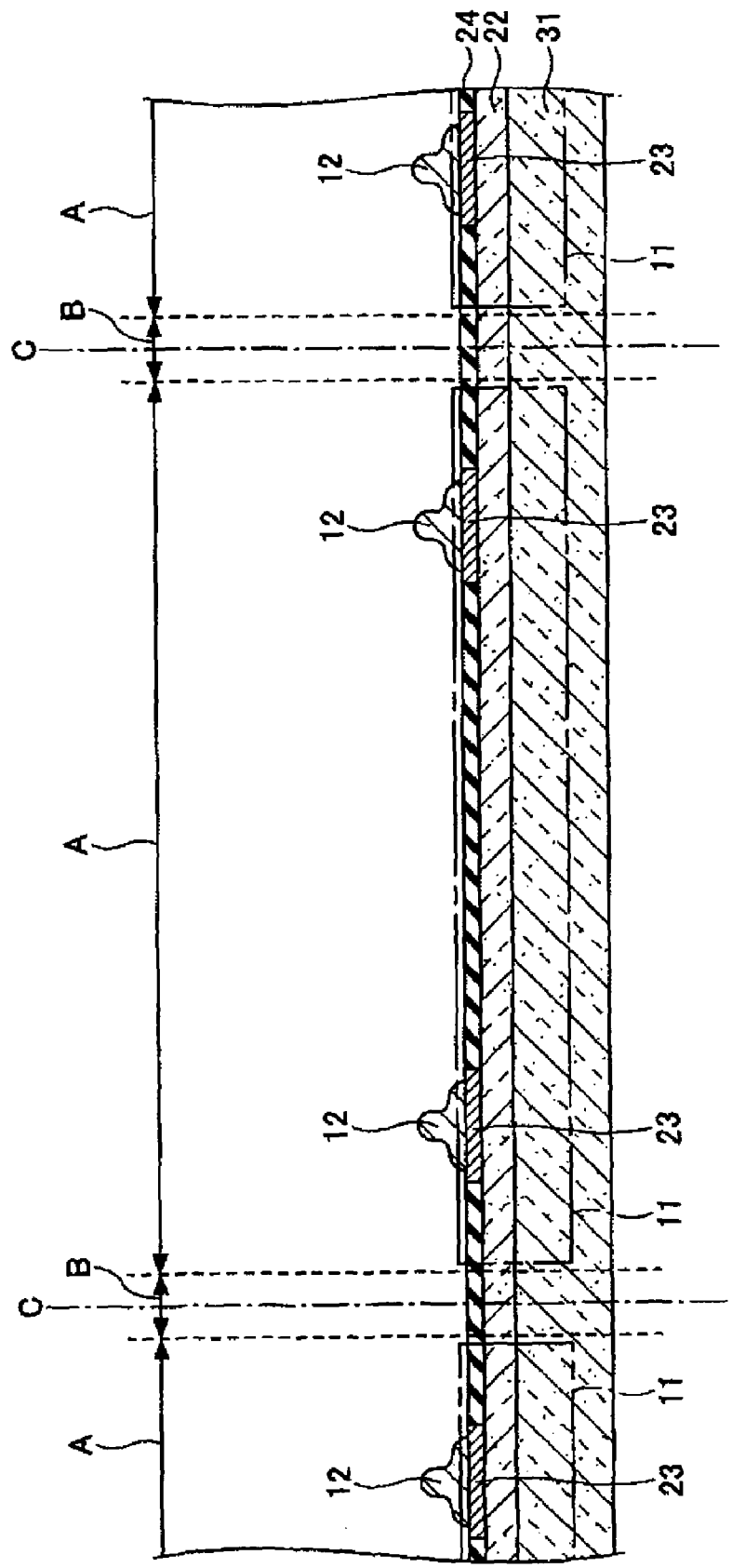
FIG. 16 is a view (No. 3) exemplifying the manufacturing process for the semiconductor device according to the first embodiment of the invention.

Then, in a step illustrated in FIG. 16, internal connection terminals 12 are formed on a plurality of electrode pads 23 provided on the plurality of semiconductor device formation areas A. For example, an Au bump, a Cu bump, an Au-plating-film, a metal film including a Ni-film, which is formed by a nonelectrolytic plating method and a method for zincating Al substrates, and an Au-film stacked on the Ni-film, or the like can be used as the internal connection terminal 12. Au-bumps or Cu-bumps can be formed by a bonding wire using a wire bonding apparatus. Alternatively, Au-bumps or Cu-bumps can be formed by a plating method. Incidentally, there is a variance in height among the plurality of internal connection terminals 12 formed in the step illustrated in FIG. 16.

Subsequently, in a step illustrated in FIG. 17, an insulating layer 13 is formed to cover the plurality of semiconductor chips 11 (more specifically, the front surface side of the plurality of semiconductor chips 11) on the side, on which the internal connection terminals 12 are provided, and the internal connection terminals 12. The insulating layer 13 is constructed by including the alpha ray blocking material. For example, an insulating resin brought into a B-stage state (semi-cured state), and tinged with a black-based color by containing, e.g., a black-based material, such as carbon black, and a black-based organic pigment or the like, in addition to the alpha ray blocking material, such as modified polyimide can be cited as the examples of such an insulating resin. Insulating resin or the like, which can be used in the device according to the invention, are as described above.

In the case of using a cohesive sheet-like insulating resin or anisotropic electrically conductive resin, the insulating layer 13 is formed by attaching the sheet-like insulating resin or anisotropic electrically conductive resin on the top surface side of a structure illustrated in FIG. 16. Further, in the case of using a paste-like insulating resin or anisotropic electrically conductive resin as the material of the insulating layer 13, the paste-like insulating resin or anisotropic electrically conductive resin is formed on the top surface side of the structure illustrated in FIG. 16 by a printing method. Subsequently, the insulating resin or the anisotropic electrically conductive resin is semi-cured by performing prebaking. This semi-cured insulating resin or anisotropic electrically conductive resin has adhesiveness. The thickness $T_4$ of the insulating layer 13 can be set to range from, e.g., 20 μm to 100 μm.

According to the invention, e.g., the insulating resin containing an alpha ray blocking material, such as modified polyimide, is used as the material of the insulating layer 13. However, there have hitherto been processes of forming the insulating layer 13 themselves. That is, the insulating layer 13 capable of blocking alpha rays can be formed in the same step as that of the conventional process only by changing the constitution of the material thereof. Thus, an additional step of forming a new layer for blocking alpha rays is unnecessary.

Figure 17:
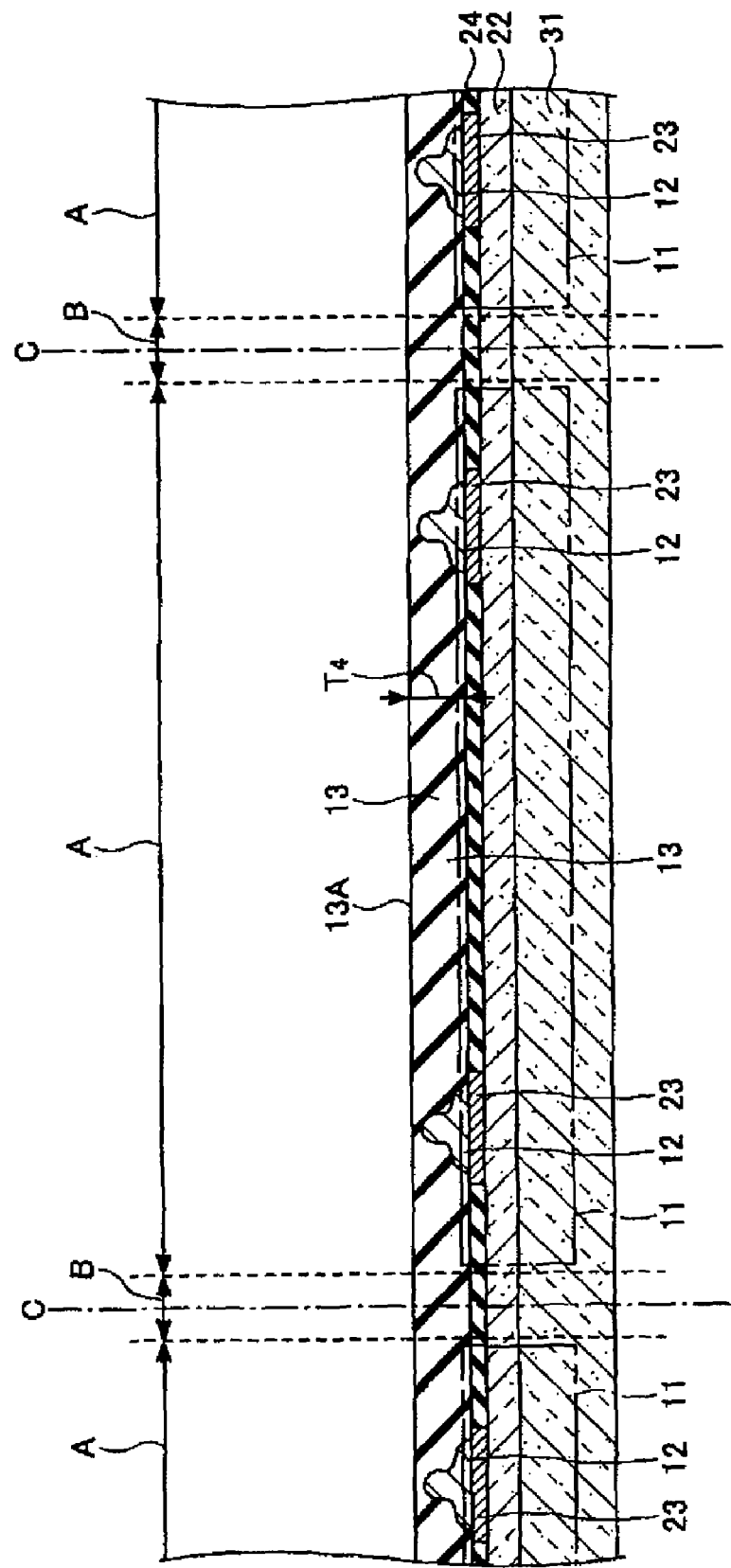
FIG. 17 is a view (No. 4) exemplifying the manufacturing process for the semiconductor device according to the first embodiment of the invention.

Subsequently, in a step illustrated in FIG. 18, the insulating layer 13 is pushed from the side of the top surface 13A of the insulating layer 13 (see arrows illustrated in FIG. 18) in a state in which a structure illustrated in FIG. 17 is heated. Consequently, the top surface (more specifically, the top surface 13A of the insulating layer 13 and those 12A of the internal connection terminals 12) of the structure illustrated in FIG. 17 is formed to be a flat surface. That is, the planarization of the top surface 13A of the insulating layer 13 and that of the top surfaces 12A of the internal connection terminals 12 can be collectively and simultaneously performed.

Figure 18:
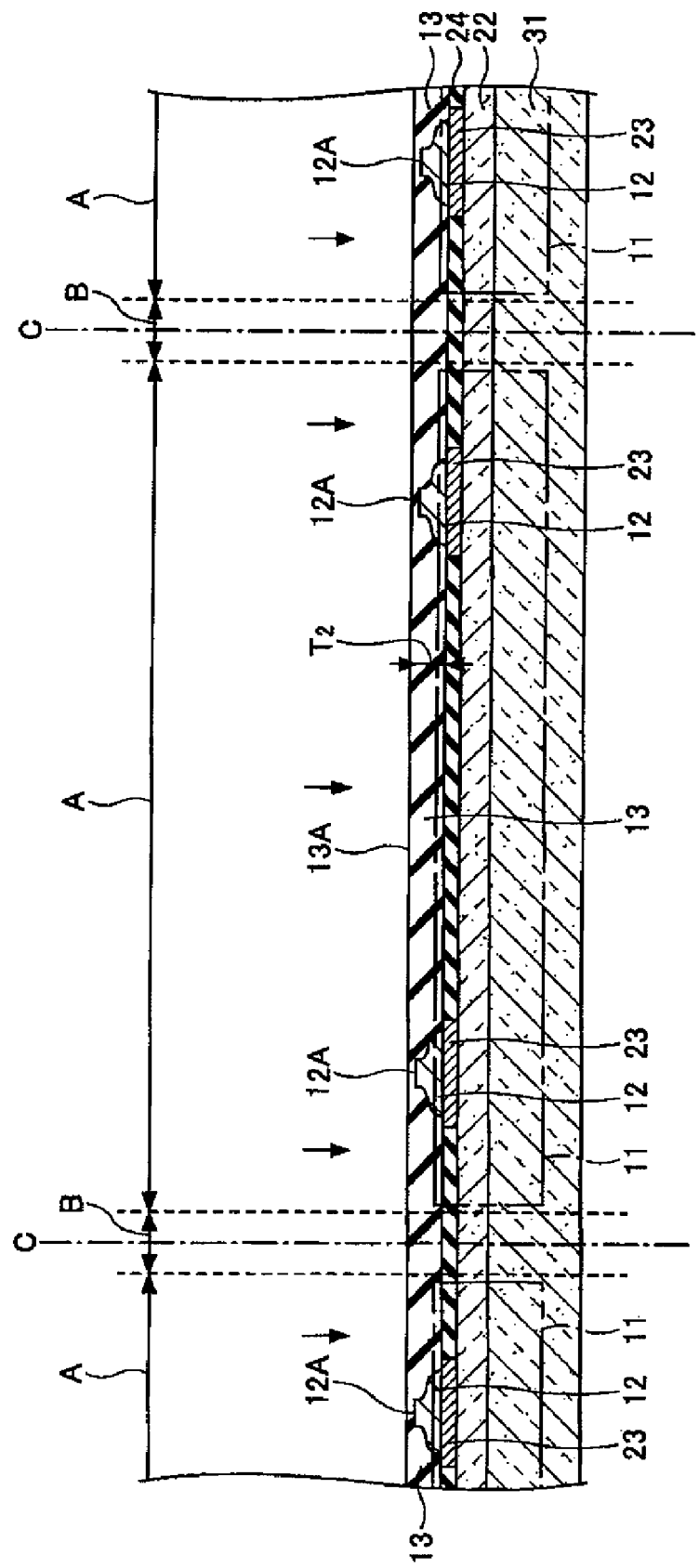
FIG. 18 is a view (No. 5) exemplifying the manufacturing process for the semiconductor device according to the first embodiment of the invention.

Further, a structure illustrated in FIG. 18 is heated at a temperature (i.e., the curing temperature of the insulating layer 13) higher than that at the time of pushing this structure. Thus, the insulating layer 13 is cured. The thickness $T_2$ of the insulating layer 13 can be set to range from, e.g., 10 μm to 60 μm. Incidentally, in this state, a part of the material constituting the insulating layer 13 adheres to the top surface 12A of the internal connection terminal 12, so that the top surface 12A of the internal connection terminal 12 is not completely exposed for the insulating layer 13.

Subsequently, in a step illustrated in FIG. 19, ashing is performed on the top surface 13A of the insulating layer 13. Consequently, the top surface 12A of the internal connection terminal 12 is completely exposed from the insulating layer 13. In addition, the top surface 13A of the insulating layer 13 is roughened. For example, oxygen ($O_2$) plasma ashing can be employed as the ashing. The $O_2$-plasma ashing is to oxidize an object in a vacuum atmosphere by oxygen radicals and ions obtained by plasma-exciting oxygen gas, and to eliminate the oxidized object as a gaseous reaction product such as carbon mono-oxide (CO) and carbon dioxide ($CO_2$).

Various inactive gases can be added to a supplied oxygen gas, as occasion demands. For example, an argon-based gas, a hydrogen-based gas, a nitrogen-based gas, and carbon-fluoride-based (CF-based) gases, such as carbon tetrafluoride ($CF_4$) and carbon hexafluoride ($C_2F_6$) can be used as the inactive gas. Incidentally, ozone ashing can be used, instead of plasma ashing. However, in the case of some material of the insulating layer 13, sufficient etching characteristics cannot be obtained. In addition, it should be noted that the ozone ashing is inferior in etching-rate to the plasma ashing, and that productivity is reduced in the case of performing ozone ashing, as compared with the case of performing $O_2$-plasma ashing.

The surface subjected to the ashing is roughened, so that minute irregularities are formed thereon. The top surface 13A of the insulating layer 13 is roughened by processing performed in the step illustrated in FIG. 19. Thus, the adhesion between the top surface 13A of the insulating layer 13 and the first metal layer 26 formed thereon can be enhanced in a step illustrated in FIG. 20, which is described below. Further, the top surface 13A of the insulating layer 13 and the solder resist 16 formed in a step illustrated in FIG. 25, which is described below, can be enhanced.

Incidentally, in order to roughen the top surface 13A of the insulating layer 13, the following method can be employed. That is, a copper foil whose one side surface is roughened is provided on the top surface 13A of the insulating layer 13. Then, press-fitting is performed thereon. Subsequently, the copper foil is removed. Thus, the roughened surface of the copper foil is transferred onto the top surface 13A of the insulating layer 13. However, according to this method, the manufacturing process is complicated. In addition, a copper foil is discarded every time this method is performed, so that the material cost is increased. Consequently, this method causes a problem that the manufacturing cost thereof increases. According to the invention, the top surface 13A of the insulating layer 13 is roughened by performing ashing thereon Thus, such a problem does not occur. Accordingly, an increase in the manufacturing cost of the semiconductor device 10 can be restrained.

Figure 20:
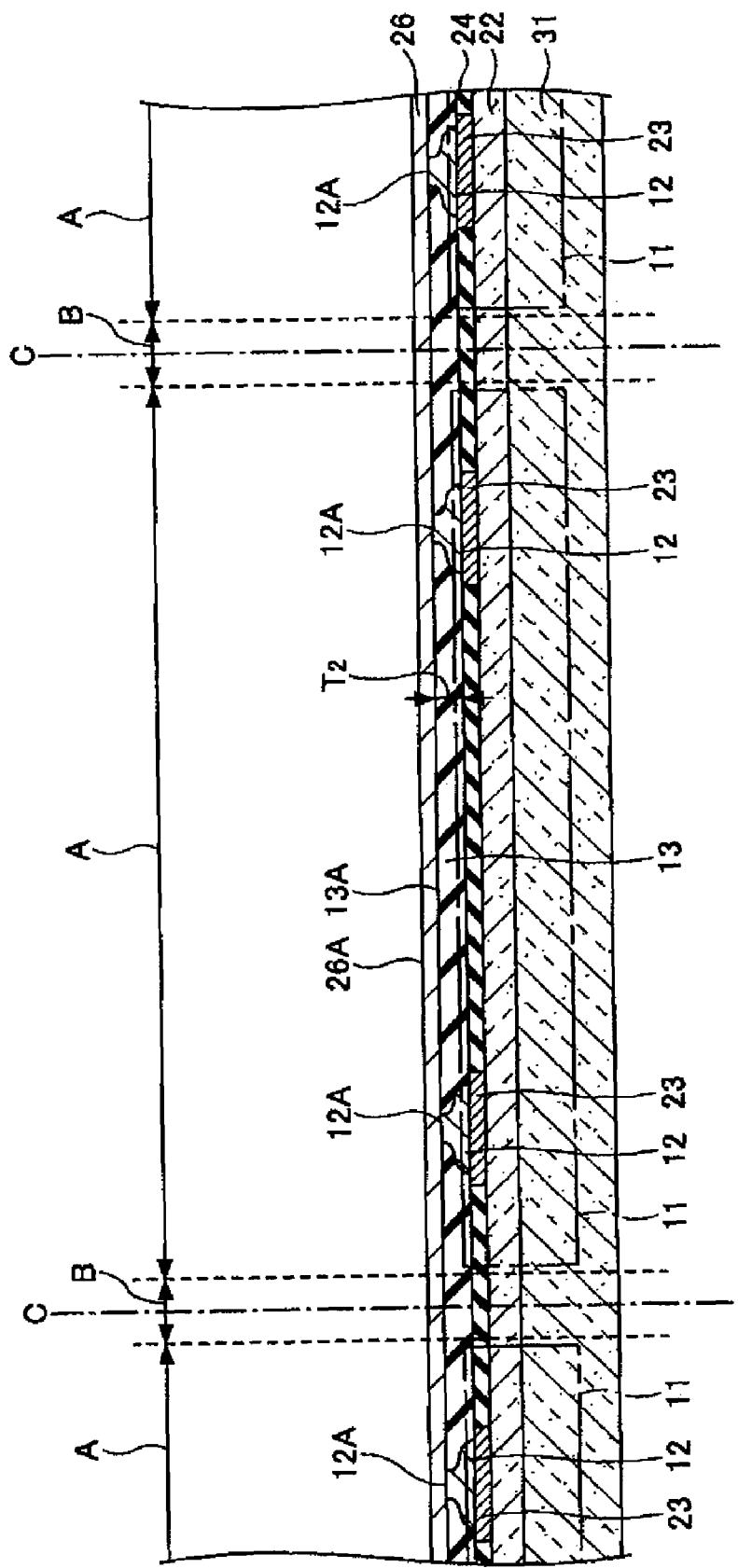
FIG. 20 is a view (No. 7) exemplifying the manufacturing process for the semiconductor device according to the first embodiment of the invention.

Subsequently, in a step illustrated in FIG. 20, the first metal layer 26 is formed on the top surface 13A of the insulating layer 13 and those 12A of the internal connection terminals 12. The first metal layer 26 can be constructed so that a Ti-film, a Cr-film and a Cu-film are sequentially stacked on the top surface 13A of the insulating layer 13 and those 12A of the internal connection terminals 12, or that a Cu-film is formed on the top surface 13A of the insulating layer 13 and those 12A of the internal connection terminals 12. The invention is characterized in that the first metal layer 26 is formed by a vapor deposition method.

Any of physical vapor deposition methods, such as a sputtering method, a vacuum deposition method, and an ion plating method, and chemical vapor deposition methods, such as a metal chemical vapor deposition (CVD) method, can be employed as the vapor deposition method. However, preferably, the physical vapor deposition method is employed. This is because of the facts that the metal CVD method is not in widespread use for manufacturing a semiconductor device, and that increase in the manufacturing cost, which is caused due to the introduction cost of a chemical vapor deposition apparatus, is problematic. More preferably, a sputtering method is used as the physical vapor deposition method. This is because of the facts that the general versatility of the sputtering method is highest, and that a high-purity dense metal film can easily be formed by the sputtering method.

Hereinafter, a method of forming a Ti-film or each of a Cr-film and a Cu-film, which constitutes the first metal layer 26, using a sputtering method serving as a type of the physical vapor deposition method is concretely described. In a case where the first metal layer 26 is constituted by a Ti-film and a Cu-film, first, a Ti-film is formed on the top surface 13A of the insulating layer 13 and those 12A of the internal connection terminals 12 by performing sputtering using Ti as a target. Subsequently, a Cu-film is formed by performing sputtering using Cu as a target. Incidentally, in order to enhance the adhesion between the top surface 13A of the insulating layer 13 and Ti, nitrogen ($N_2$) reverse sputtering or argon (Ar) reverse sputtering can be performed.

The reverse sputtering, the Ti sputtering, and the Cu sputtering can be continuously performed using the same sputtering apparatus. Preferably, the thickness of a Ti-film is equal to or more than 0.05 µm and is equal to or less than 2 µm. The thickness of a Cu-film is equal to or more than 0.2 µm and is equal to or less than 1.5 µm. Such conditions are derived by the present inventors from results of repeatedly performing an adhesion test and verifying a sheet resistance value needed to achieve favorable electrolytic plating. The adhesion between the top surface 13A of the insulating layer 13 and the Ti-film, between the Ti-film and the Cu-film and between the Cu-film and the wiring pattern 14 can be enhanced by setting the thicknesses of the Ti-film and the Cu-film in the aforementioned ranges, respectively. Further, the ability to perform electrolytic plating can be favorably maintained.

Incidentally, in the case of some types of materials (black-based insulating resin or the like) constituting the insulating layer 13, the high adhesion between the top surface 13A of the insulating layer 13 and the Cu-film can be obtained without forming a Ti-film even when a Cu-film is formed directly on the top surface 13A of the insulating layer 13. In the case of using such a material as that of the insulating layer 13, a Cu-film can be formed by performing sputtering using Cu as a target after ashing illustrated in FIG. 19 is performed on the top surface 13A of the insulating layer 13. Alternatively, a Cu-film can be formed by performing, after ashing illustrated in FIG. 19 is performed on the top surface 13A of the insulating layer 13, $N_2$ reverse sputtering or Ar reverse sputtering and then performing sputtering using Cu as a target.

That is, in the case of some types of materials (black-based insulating resin or the like) constituting the insulating layer 13, the invention can eliminate the step of forming a Ti-film on the top surface 13A of the insulating layer 13 by sputtering using Ti as a target before a Cu-film is formed, and the step of performing $N_2$ reverse sputtering or Ar reverse sputtering to enhance the adhesion between the top surface 13A of the insulating layer 13 and Ti before sputtering of Ti onto the top surface 13 A of the insulating layer 13 is performed.

In a case where the first metal layer 26 is constituted by a Cr-film and a Cu-film, first, a Cr-film is formed by performing sputtering on the top surface 13A of the insulating layer 13 and the top surfaces 12A of the internal connection terminals 12 using Cr as a target. Subsequently, a Cu-film is formed by performing sputtering using Cu as a target. Incidentally, in order to enhance the adhesion between the top surface 13A of the insulating layer 13 and Cr, $N_2$ reverse sputtering or Ar reverse sputtering can be performed before sputtering of Cr onto the top surface 13A of the insulating layer 13 is performed.

A Cr-film, and a Cu-film can be continuously formed using the same sputtering apparatus. Preferably, the thickness of the Cr-film is equal to or more than 0.01 µm and is equal to or less than 0.05 µm. The thickness of a Cu-film is equal to or more than 0.2 µm and is equal to or less than 1.5 µm. Such conditions are derived by the present inventors from results of repeatedly performing an adhesion test and verifying a sheet resistance value needed to achieve favorable electrolytic plating. The adhesion between the top surface 13A of the insulating layer 13 and the Cr-film, between the Cr-film and the Cu-film and between the Cu-film and the wiring pattern 14 can be enhanced by setting the thicknesses of the Cr-film and the Cu-film in the aforementioned ranges, respectively. Further, the ability to perform electrolytic plating can be favorably maintained.

Incidentally, in the case of some types of materials (black-based insulating resin or the like) constituting the insulating layer 13, the high adhesion between the top surface 13A of the insulating layer 13 and the Cu-film can be obtained without forming a Cr-film even when a Cu-film is formed directly on the top surface 13A of the insulating layer 13. In the case of using such a material as that of the insulating layer 13, a Cu-film can be formed by performing sputtering using Cu as a target after ashing illustrated in FIG. 19 is performed on the top surface 13A of the insulating layer 13. Alternatively, a Cu-film can be formed by performing, after ashing illustrated in FIG. 19 is performed on the top surface 13A of the insulating layer 13, $N_2$ reverse sputtering or Ar reverse sputtering and then performing sputtering using Cu as a target.

That is, in the case of some types of materials (black-based insulating resin or the like) constituting the insulating layer 13, the invention can eliminate the step of forming a Cr-film on the top surface 13A of the insulating layer 13 by sputtering using Cr as a target before a Cu-film is formed, and the step of performing $N_2$ reverse sputtering or Ar reverse sputtering to enhance the adhesion between the top surface 13A of the insulating layer 13 and Cr before sputtering of Cr onto the top surface 13 A of the insulating layer 13 is performed.

Thus, according to the first embodiment of the invention, the first metal layer 26 (i.e., a structure in which a Ti-film and a Cu-film are stacked, a structure in which a Cr-film and a Cu-film are stacked, or a single layer structure constituted by a Cu-film) is formed employing a vapor deposition method such as a sputtering method. Thus, the top surface 12A of each of the internal connection terminals 12 exposed from the top surface 13A of the insulating layer 13 is metal-joined with the Ti-film, the Cr-film or the Cu-film. Further, in the cases of the structure in which the Ti-film and the Cu-film are stacked, and the structure in which the Cr-film and the Cu-film are stacked, the Cu-film formed on an upper portion of the Ti-film or the Cr-film is formed using a sputtering method. Accordingly, the Ti-film or the Cr-film is metal-joined with the Cu-film.

Accordingly, as compared with the conventional joining method using press-contacting and an electrically conductive paste, the top surface 12A of the internal connection terminal 12 can be strongly joined with the first metal layer 26. Thus the reliability of the mechanical and electrical connection therebetween can be enhanced.

Meanwhile, according to the first embodiment of the invention, a second metal layer 27 is formed by a vapor deposition method such as a sputtering method on the top surface 13A of the insulating layer 13 constituted by resin or the like via the first metal layer 26. Accordingly, the first metal layer 26 is formed on the top surface 13A of the insulating layer 13 as a closely-attached metal layer to thereby enhance the adhesion therebetween. Thus, there is concern about the reliability of the adhesion between the first metal layer 26 and the top surface 13A thereof. However, according to the first embodiment of the invention, the top surface 13A of the insulating layer 13 is roughened by the aforementioned processing in the step illustrated in FIG. 19 to thereby form minute irregularities. Consequently, no problems of the reliability of the adhesion between the top surface 13A of the insulating layer 13 and the first metal layer 26 are caused. That is, double countermeasures are taken, which are the generation of the anchor effect due to the minute irregularities formed on the top surface 13A of the insulating layer 13 and the formation of the first metal layer 26.

Figure 29:
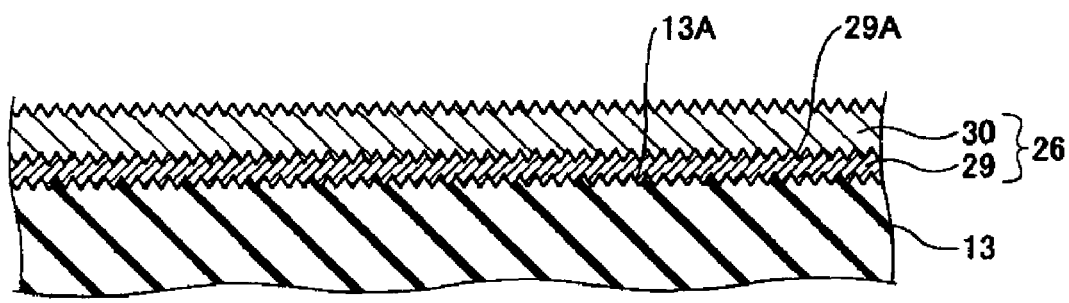
FIG. 29 is an enlarged cross-sectional view exemplifying an insulating layer and a first metal layer illustrated in FIG. 20.

The reliability of the adhesion between the top surface 13A of the insulating layer 13 and the first metal layer 26 is described hereinafter with reference to FIG. 29 by taking the case of setting the first metal layer 26 to have a structure, in which a Ti-film and a Cu-film are stacked or in which a Cr-film and a Cu-film are stacked, as an example. FIG. 29 is a cross-sectional view enlargedly exemplifying a portion including the insulating layer and the first metal layer illustrated in FIG. 20. In FIG. 29, reference numeral 29 designates a Ti-film and a Cr-film which constitute the first metal layer 26. Reference numeral 29A denotes the top surface of the Ti-film or the Cr-film. Reference numeral 30 designates Cu-film constituting the first metal layer 26.

Figure 19:
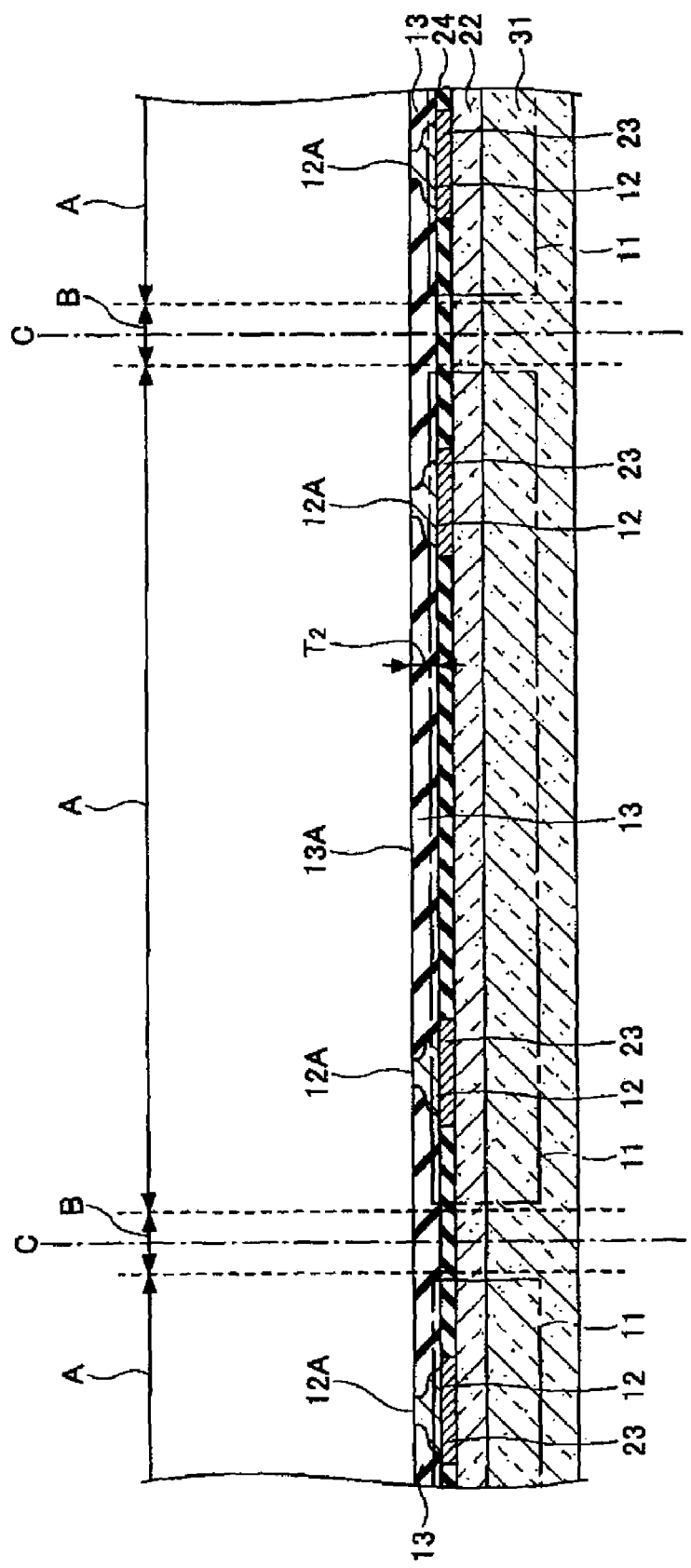
FIG. 19 is a view (No. 6) exemplifying the manufacturing process for the semiconductor device according to the first embodiment of the invention.

The top surface 13A of the insulating layer 13 is roughened by the aforementioned processing in the step illustrated in FIG. 19. Thus, the minute irregularities illustrate in FIG. 29 are formed. A Ti-film or a Cr-film 29 is formed o the top surface 13A of the insulating layer 13 by the vapor deposition method such as a sputtering method. Thus, the Ti-film or the Cr-film 29 is put into the minute irregularities. Accordingly, what is called an anchor effect is obtained between the top surface 13A of the insulating layer 13 and the Ti-film or the Cr-film 29.

Consequently, even in a case where the insulating layer 13 is made of resin or the like, a Ti-film or a Cr-film 29 can reliably be formed on the top surface 13A of the insulating layer 13. Thus, the Ti-film or the Cr-film 29 can be prevented from being exfoliated from the top surface 13A of the insulating layer 13. Accordingly, the reliability of the semiconductor device 10 can be enhanced. The reliability of the adhesion therebetween is enhanced by taking the double countermeasures, i.e., the use of the Ti-film or the Cr-film 29 and the generation of the anchor effect due to the minute irregularities formed on the top surface 13A of the insulating layer 13.

Further, as illustrated in FIG. 29, the minute irregularities formed on the top surface 13A of the insulating layer 13 are transferred to the top surface 29A of the Ti-film or the Cr-film 29 formed thereon. Thus, the top surface 29A of the Ti-film or the Cr-film 29 is roughened, so that minute irregularities are formed on the top surface 29A thereof. Consequently, the anchor effect is caused between the Ti-film or the Cr-film 29 and the Cu-film 30 formed on the top surface 29A thereof. Thus, the adhesion between the Ti-film or the Cr-film 29 and the Cu-film 30 can be enhanced. Further, the adhesion between a resist layer 28 described below and the Cu-film 30 can be enhanced, and thus occurrence of poor etching at the formation of the wiring pattern 14 can be prevented.

The reason for forming the first metal layer 26, in which the Ti-film or the Cr-film 29 and the Cu-film 30 are stacked, is that the first metal layer 26 is used as an electric supply layer. The adhesion between the Ti-film or the Cr-film 29 and the material constituting the insulating layer 13 is high (thus, the film 29 is used as the closely-attached metal layer). However, the electric resistance of the first metal layer 26 formed only of the Ti-film or the Cr-film 29 is high. Thus, this metal layer 26 is not suitable to be used as an electric supply layer. The electric resistance of the first metal layer 26 can be reduced to a low level by stacking the Cu-film 30, whose electric resistance (or sheet resistance) is low, on the Ti-film or the Cr-film 29. Consequently, the first metal layer 26 can be used as an electric supply layer.

Figure 21:
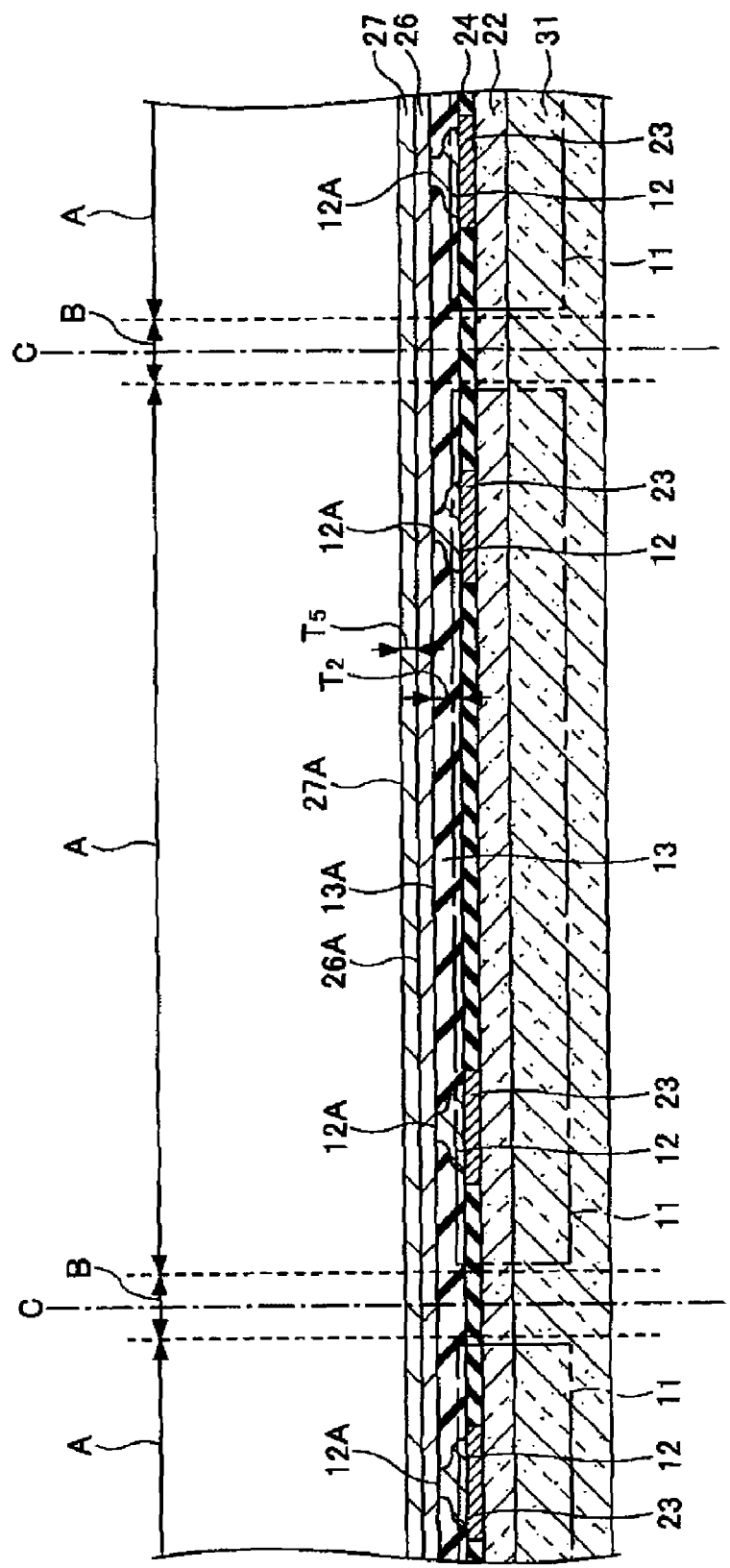
FIG. 21 is a view (No. 8) exemplifying the manufacturing process for the semiconductor device according to the first embodiment of the invention.

Subsequently, in a step illustrated in FIG. 21, a second metal layer 27 is formed by electrolytic plating or the like to cover the top surface (the top surface 26A of the first metal layer 26) of the structure illustrated in FIG. 20, using, e.g., the first metal layer 26 as an electric supply layer. For example, Cu can be used as the material of the second metal layer 27. The thickness $T_5$ of the second metal layer 27 can be set at, e.g., 10 µm.

Figure 22:
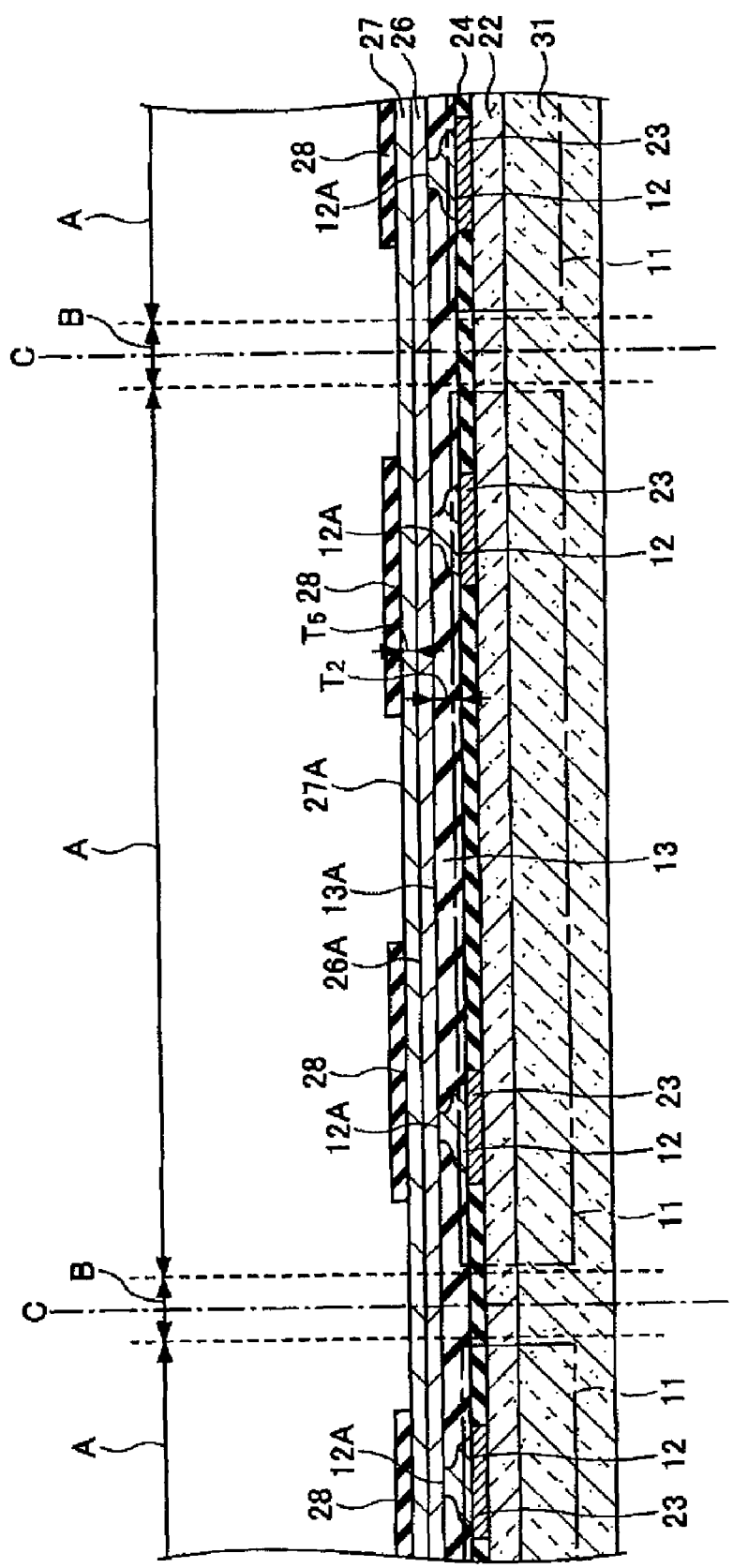
FIG. 22 is a view (No. 9) exemplifying the manufacturing process for the semiconductor device according to the first embodiment of the invention.

Then, in a step illustrated in FIG. 22, resist is applied to the top surface 27A of the second metal layer 27. Subsequently, a resist film 28 is formed on an upper part 27A of the second metal layer 27, which is a portion corresponding to the area for forming the wiring pattern 14, by exposing and developing this resist.

Figure 23:
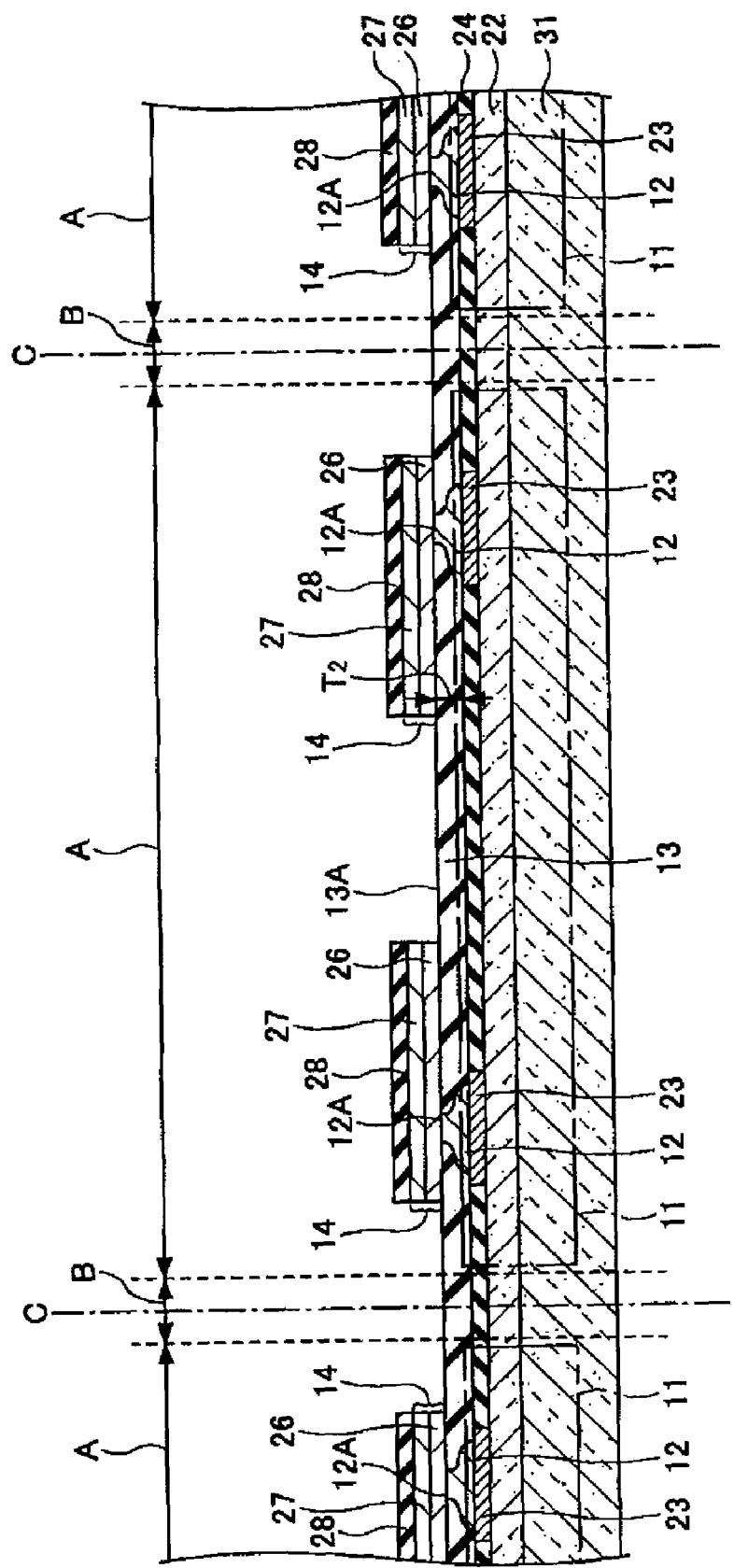
FIG. 23 is a view (No. 10) exemplifying the manufacturing process for the semiconductor device according to the first embodiment of the invention.

Then, in a step illustrate in FIG. 23, he second metal layer 27 and the first metal layer 26 are etched using the resist film 28 as a mask. The wiring pattern 14 is formed by removing the first metal layer 26 and the second metal layer 27 on a portion on which the resist film 28 is not formed.

Figure 24:
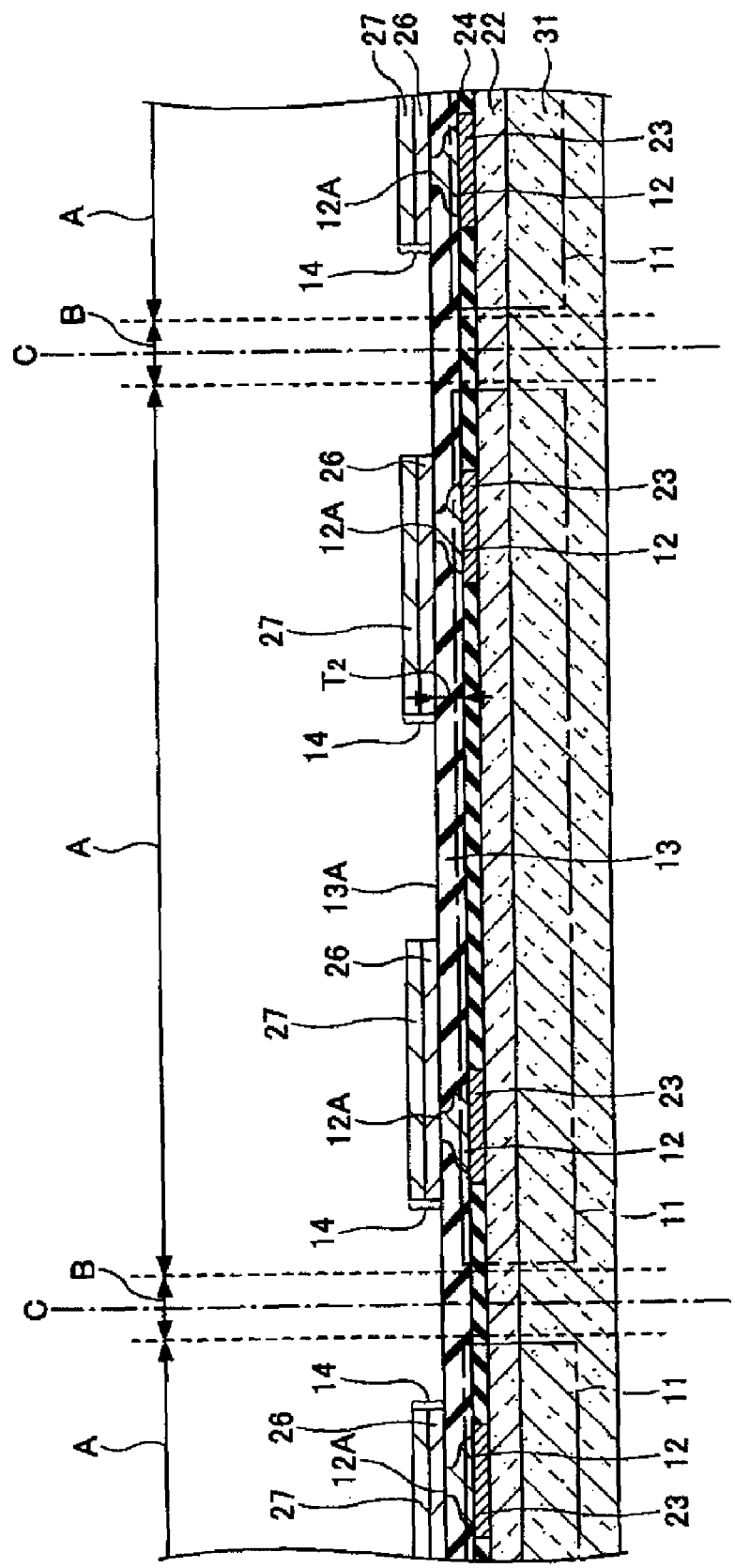
FIG. 24 is a view (No. 11) exemplifying the manufacturing process for the semiconductor device according to the first embodiment of the invention.

Subsequently, in a step illustrated in FIG. 24, the resist film 28 illustrated in FIG. 23 is removed. Then, the roughening of the wiring pattern 14 is performed. The roughening of the wiring pattern 14 can be performed by one of blackening and roughening etching. The roughening is performed in order to enhance the adhesion between the wiring pattern 14 and the solder resist 16 formed on each of the top surface and a side surface of the wiring pattern 14.

Figure 25:
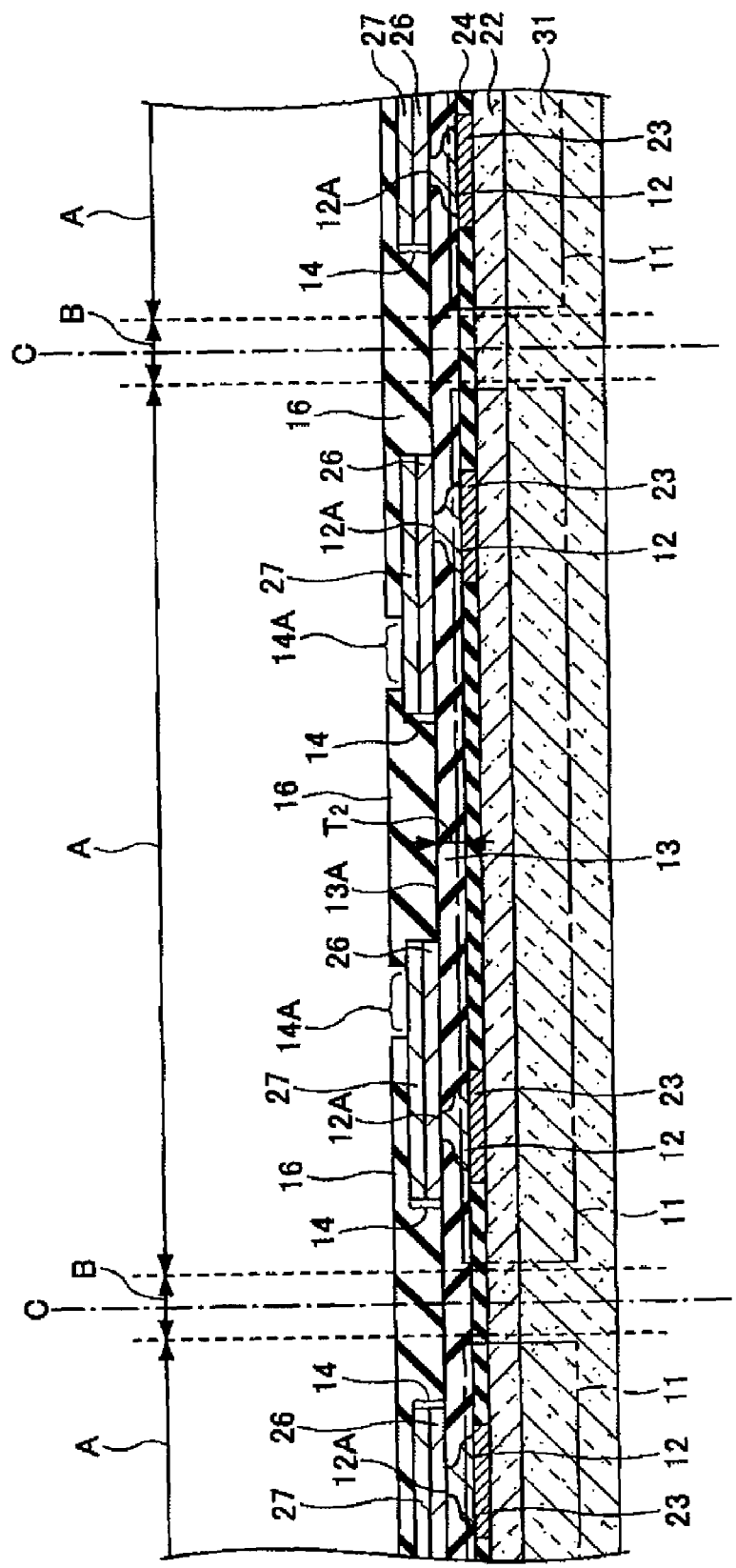
FIG. 25 is a view (No. 12) exemplifying the manufacturing process for the semiconductor device according to the first embodiment of the invention.

Subsequently, in a step illustrated in FIG. 25, resist is applied to cover the wiring pattern 14 and the insulating layer 13. Then, the resist is exposed and developed by a photolithography method. The resist applied to a portion corresponding to the external connection terminal provision area 14A is removed by etching. Thus, a solder resist 16 having an opening portion, from which the external connection terminal provision area 14A is exposed, is formed. For example, resins, which contain no inorganic filler and contain epoxy, epoxy acrylate, cyanate ester, or siloxane as a major ingredient, can be used as the material of the solder resist 16.

Figure 26:
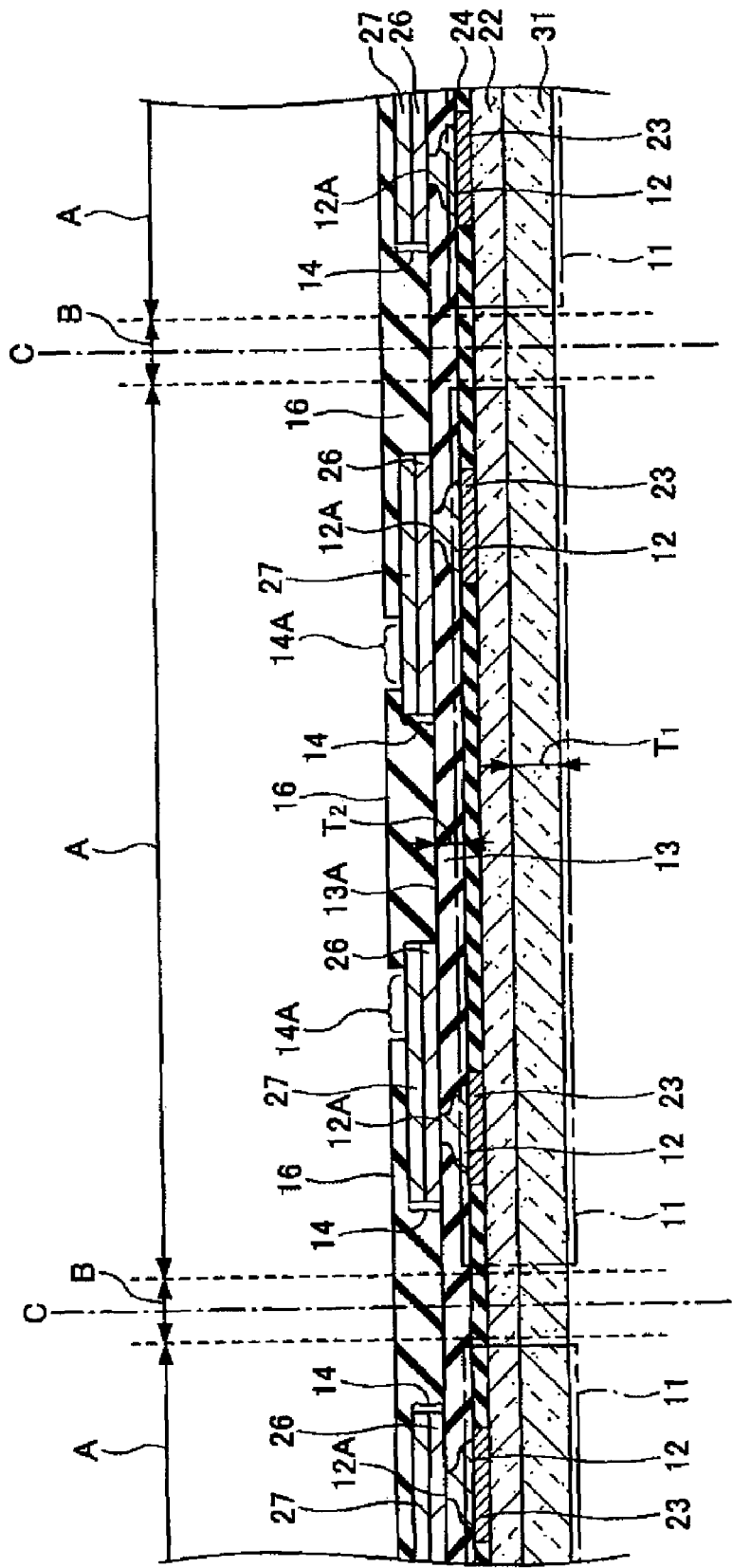
FIG. 26 is a view (No. 13) exemplifying the manufacturing process for the semiconductor device according to the first embodiment of the invention.

Then, in a step illustrated in FIG. 26, the semiconductor substrate 31 is laminated by polishing or grinding the semiconductor substrate 31 from the rear surface side thereof For example, a backside grinder can be used for laminating the semiconductor substrate 31. The thickness $T_1$ of the laminated semiconductor substrate 31 can be set to range from, e.g., 50 µm to 500 µm. Incidentally, the step illustrated in FIG. 26 is sometimes omitted.

Figure 27:
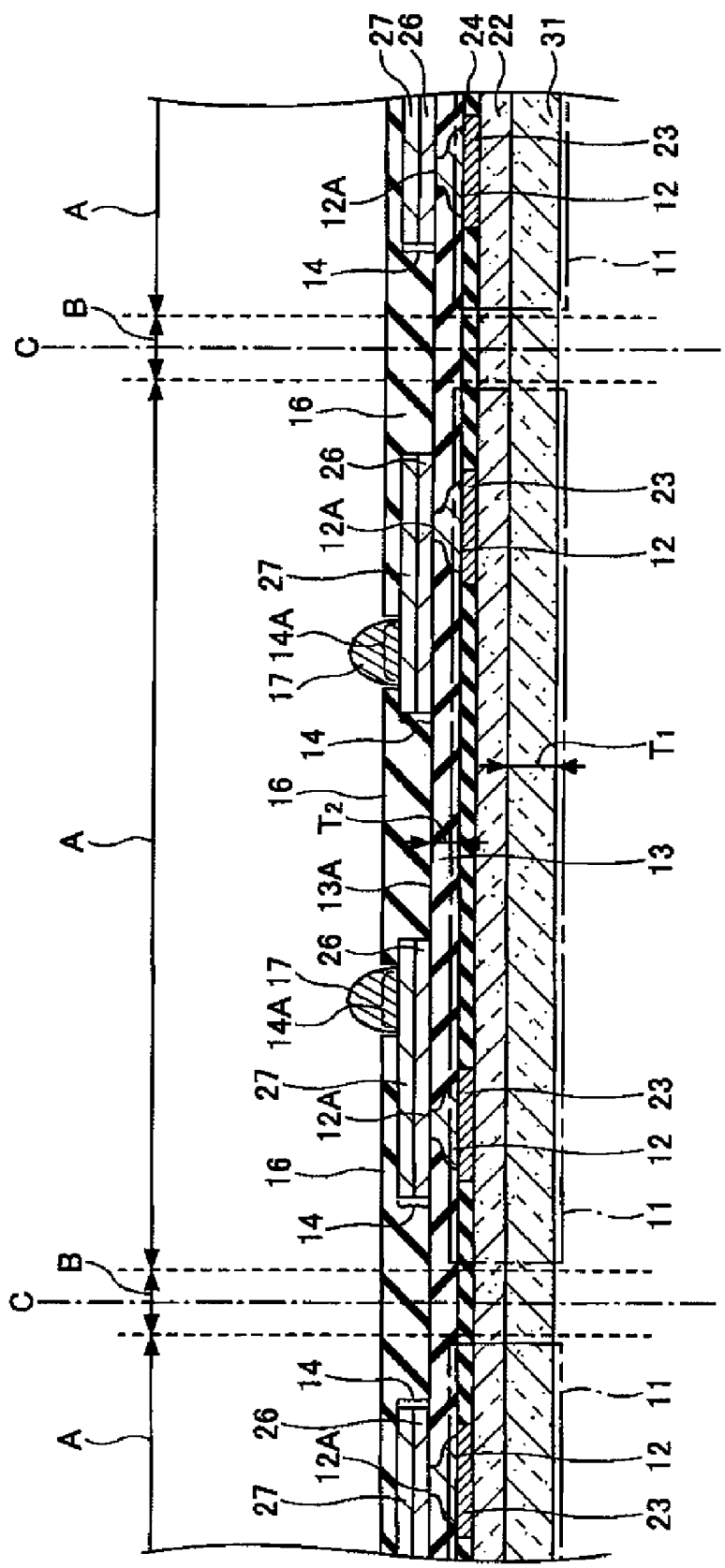
FIG. 27 is a view (No. 14) exemplifying the manufacturing process for the semiconductor device according to the first embodiment of the invention.
Figure 28:
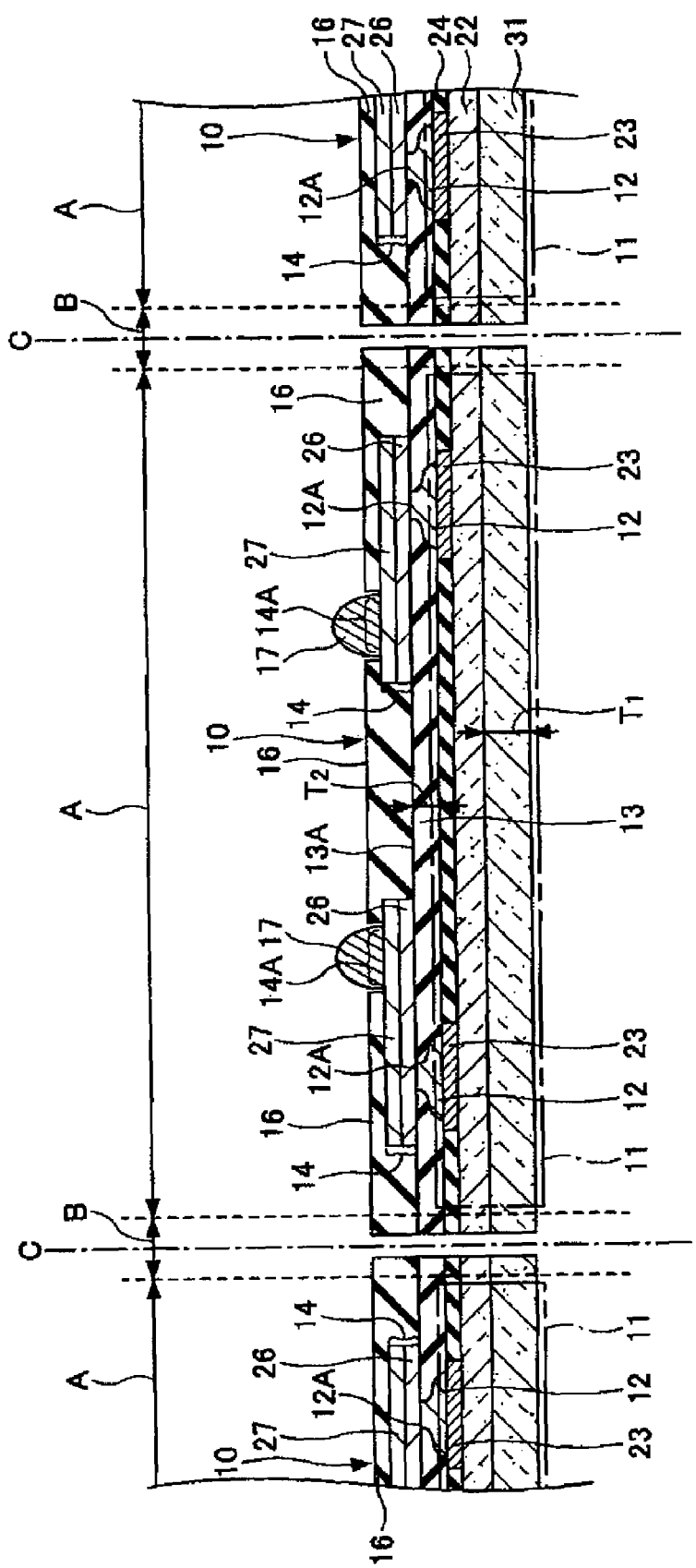
FIG. 28 is a view (No. 15) exemplifying the manufacturing process for the semiconductor device according to the first embodiment of the invention.

Subsequently, in a step illustrated in FIG. 27, the external connection terminal 17 is formed on the external connection terminal provision area 14A of the wiring pattern 14. Pb-free solder, e.g., Sn-3.5Ag, or Sn-3.0Ag-0.5Cu is used as the material of the external connection terminal 17. The reason is described above. Consequently, a structure corresponding to the semiconductor device 10 is formed on each of a plurality of semiconductor device formation areas A. Incidentally, the order of performing the step illustrated in FIG. 26 and the step illustrated in FIG. 27 can be changed. At that time, the rear surface of the semiconductor substrate 31 is polished by forming back grinding tape that can absorb the height of each external connection terminal 17. Subsequently, in a step illustrated in FIG. 28, the semiconductor substrate 31 corresponding to the scribe area B is cut along the substrate cutting positions C. Thus, a plurality of semiconductor devices 10 are manufactured. The cutting of the semiconductor substrate 31 is performed by, e.g. dicing.

In accordance with the semiconductor device and the manufacturing method therefor according to the first embodiment of the invention, the insulating layer 13 is constructed to contain the alpha ray blocking material, e.g., modified polyimide. Thus, the amount of alpha rays, which are generated by the exterior or the external connection terminal 17 and reach the semiconductor substrate 31 can be reduced. Occurrence of a malfunction, e.g., what is called a soft error, of the semiconductor device 10 can be prevented.

Further, an amount of inorganic filler contained in the insulating layer 13 is adjusted. Consequently, an amount of alpha rays generated by the insulating layer 13 itself (an amount of detected alpha rays) generated by the insulating layer 13 itself can be reduced to, e.g., 0.0015 count/cm$^2$·h or less.

Moreover, the solder resist 16 itself can be prevented using the solder resist 16, which contains no inorganic filler (i.e., is filler-less), from generating alpha rays.

Furthermore, the amount of alpha rays generated by the external connection terminal 17 (the amount of detected alpha rays) itself can be reduced using Pb-free solder, e.g., Sn-3.5Ag, or Sn-3.0Ag-0.5Cu as the material of the external connection terminal 17.

Further, the amount of alpha rays reaching the semiconductor substrate 21 can drastically be reduced by the synergy effects of the insulating layer 13, which is constructed by containing the alpha ray blocking material, e.g. modified polyimide and adjusting the amount of inorganic filler such that the amount of alpha rays detected therefrom is equal to or less than 0.0015 count/cm$^2$·h, the solder resist 16 which contains no inorganic filler (i.e., is filler-less), and the external connection terminal 17 using Pb-free solder. Occurrence of a soft error can be reduced.

Moreover, the insulating layer 13 is constructed by containing carbon black, which is a black-based material, and a black-based organic pigment or the like. Thus, the insulating layer 13 can block visible light rays and ultraviolet light rays. Thus, a malfunction of the semiconductor device 10 can be prevented from being caused due to a photoeletromotive force generated by irradiating visible light or ultraviolet light thereonto.

Furthermore, ashing is performed on the top surface 13A of the insulating layer 13. Thus, the top surface 13A of the insulating layer 13 can be roughened without complicating the manufacturing process and generating unnecessary material cost. Consequently, the manufacturing cost of the semiconductor device 10 can be restrained from increasing.

Further, the first metal layer 26 is formed by the vapor deposition method, such as a sputtering method, on each of the top surface 13A of the insulating layer 13 and the top surfaces 12A of the internal connection terminals 12. Thus, the top surfaces 12A of the internal connection terminals 12 can be strongly metal-joined with the first metal layer 26. The reliability of the mechanical and electrical connection therebetween can be enhanced.

Moreover, in a case where the first metal layer 26 is set to have a structure in which a Ti-film and a Cu-film are stacked, or a structure in which a Cr-film and a Cu-film are stacked, the thickness of the Ti-film constituting the first metal layer 26 is equal to or more than 0.05 µm and equal to or less than 2 µm, and that of the Cu-film constituting the first metal layer 26 is equal to or more than 0.2 µm and equal to or less than 1.5 µm, or the thickness of the Cr-film constituting the first metal layer 26 is equal to or more than 0.01 µm and equal to or less than 0.05 µm, and that of the Cu-film constituting the first metal layer 26 is equal to or more than 0.2 µm and equal to or less than 1.5 µm. Thus, the adhesion between the first metal layer 26 and each of the top surface 13A of the insulating layer 13 and the top surfaces 12A of the internal connection terminals 12, and between the first metal layer 26 and the second metal layer 27 can be enhanced. Subsequently, the ability to perform electrolytic plating can be favorably maintained. That is, a sheet resistance required to electrolytic plating can be assured.

Second Embodiment

Figure 30:
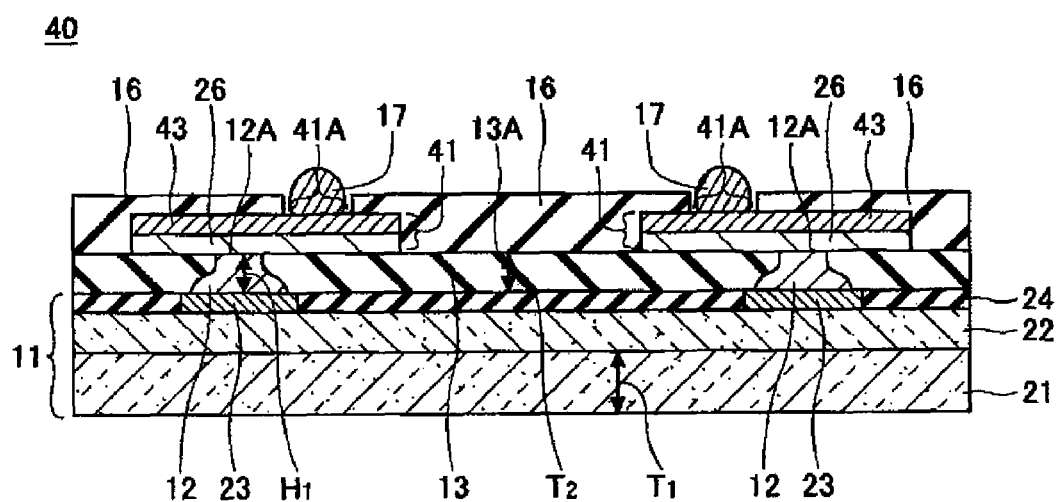
FIG. 30 is a cross-sectional view exemplifying a semiconductor device according to a second embodiment of the invention.

FIG. 30 is a cross-sectional view exemplifying a semiconductor device according to a second embodiment of the invention. In a semiconductor device 40 illustrated in FIG. 30, the same composing parts as those of the semiconductor device 10 illustrated in FIG. 12 are designated with the same reference numeral. The description of such composing parts is sometimes omitted. Referring to FIG. 30, the semiconductor device 40 according to the second embodiment is configured similarly to the semiconductor device 10 according to the first embodiment, except that a wiring pattern 41 is provided instead of the wiring pattern 14 provided in the semiconductor device 10 according to the first embodiment. The wiring pattern 41 includes a first metal layer 26 and a third metal layer 43.

The wiring pattern 14 provided in the semiconductor device 10 according to the first embodiment is formed by a subtractive method. However, in the description of the second embodiment, an example of forming the wiring pattern 41 provided in the semiconductor device 40 by a semi-additive method is described.

FIGS. 31 to 34 are views exemplifying a manufacturing process for the semiconductor device according to the second embodiment of the invention. In FIGS. 31 to 34, the same composing parts of the semiconductor device 40 illustrated in FIG. 30 are designated with the same reference numeral. The description of such composing parts is sometimes omitted. A manufacturing method for the semiconductor device 40 according to the second embodiment is described with reference to FIGS. 31 to 34. First, the structure illustrated in FIG. 20 is formed by performing processing similar to that illustrated in FIGS. 14 to 20, which has been described in the description of the first embodiment.

Figure 31:
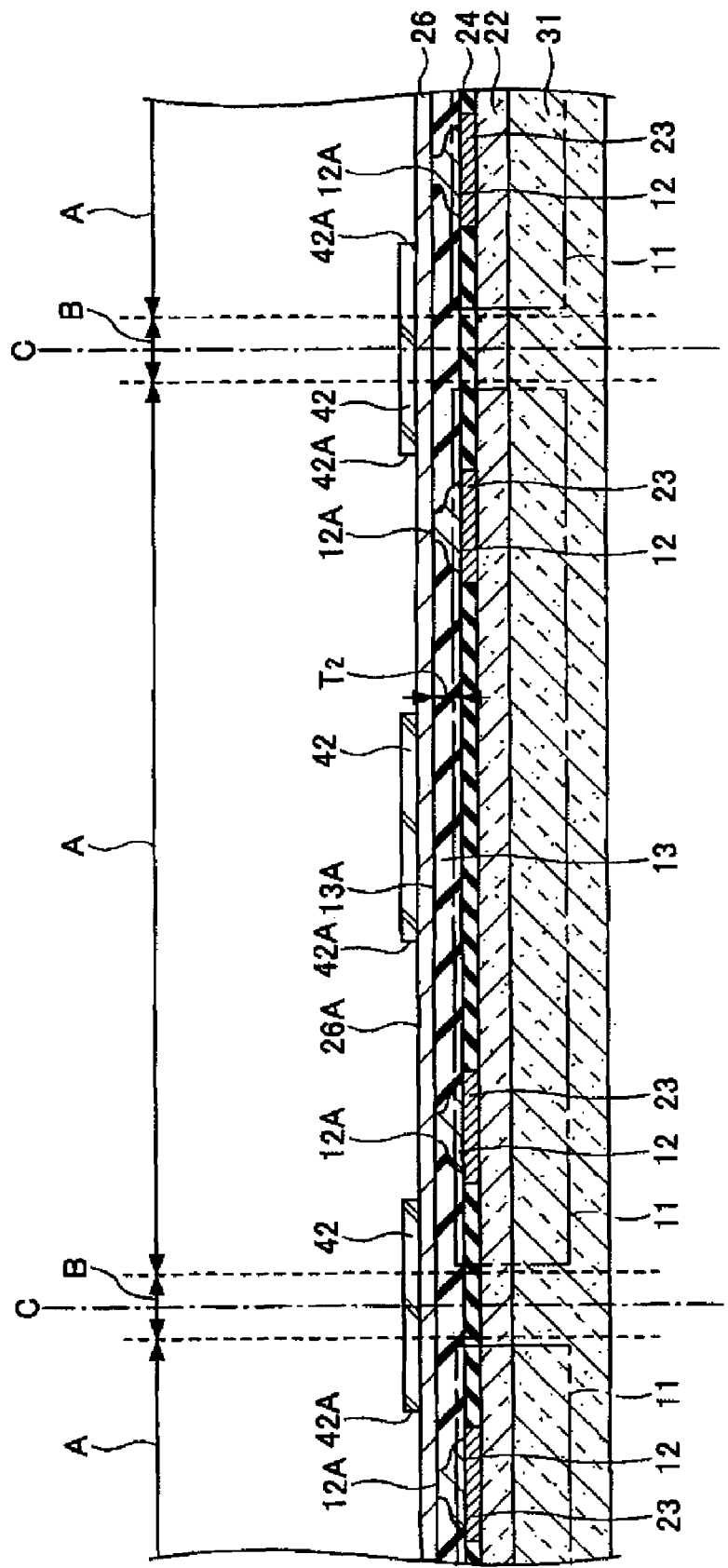
FIG. 31 is a view (No. 1) exemplifying a manufacturing process for the semiconductor device according to the second embodiment of the invention.

Subsequently, in a step illustrated in FIG. 31, resist is applied to the top surface 26A of the first metal layer 26. Then, the resist is exposed and developed. Thus, a resist film 42 having an opening portion 42A corresponding to a wiring formation area is formed. Subsequently, in a step illustrated in FIG. 32, the third metal layer 43 is formed in the opening portion 42A by an electrolytic plating method using the first metal layer 26 as an electric supply layer. The first metal layer 26 and the third metal layer 43 are electrically connected to each other. For example, Cu or the like can be used as the material of the third metal layer 43. Further, the thickness $T_6$ of the third metal layer 43 can be set to range from, e.g., 5 μm to 20 μm.

Figure 32:
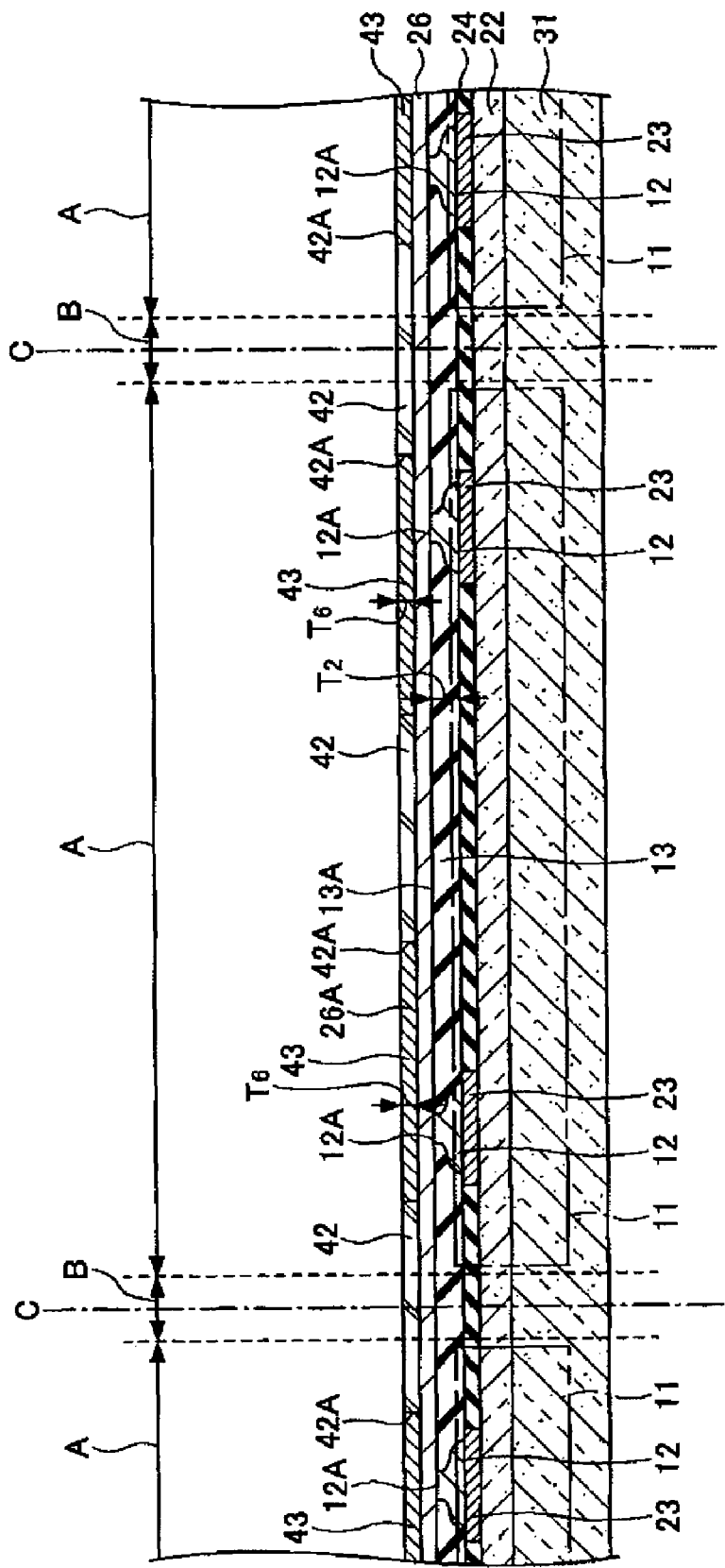
FIG. 32 is a view (No. 2) exemplifying the manufacturing process for the semiconductor device according to the second embodiment of the invention.
Figure 33:
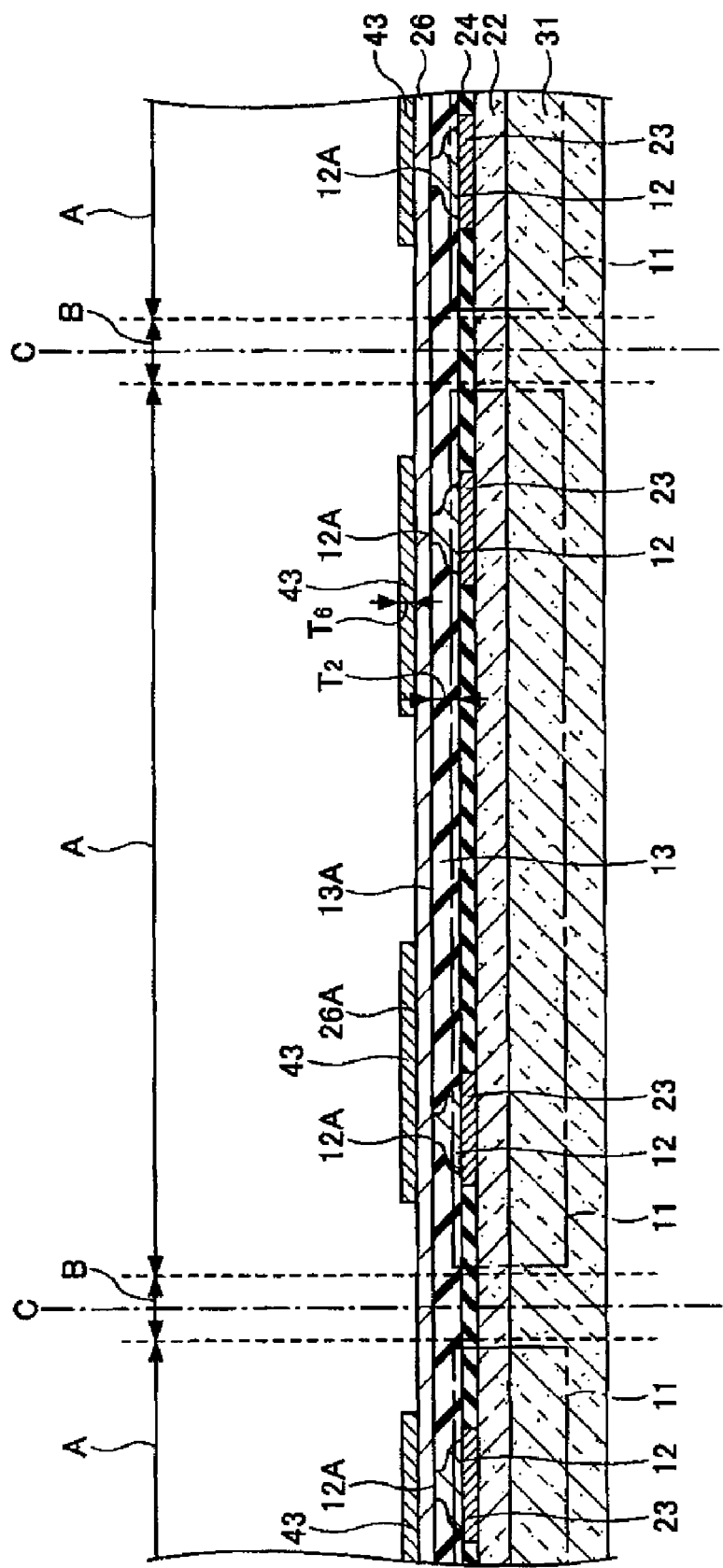
FIG. 33 is a view (No. 3) exemplifying the manufacturing process for the semiconductor device according to the second embodiment of the invention.
Figure 34:
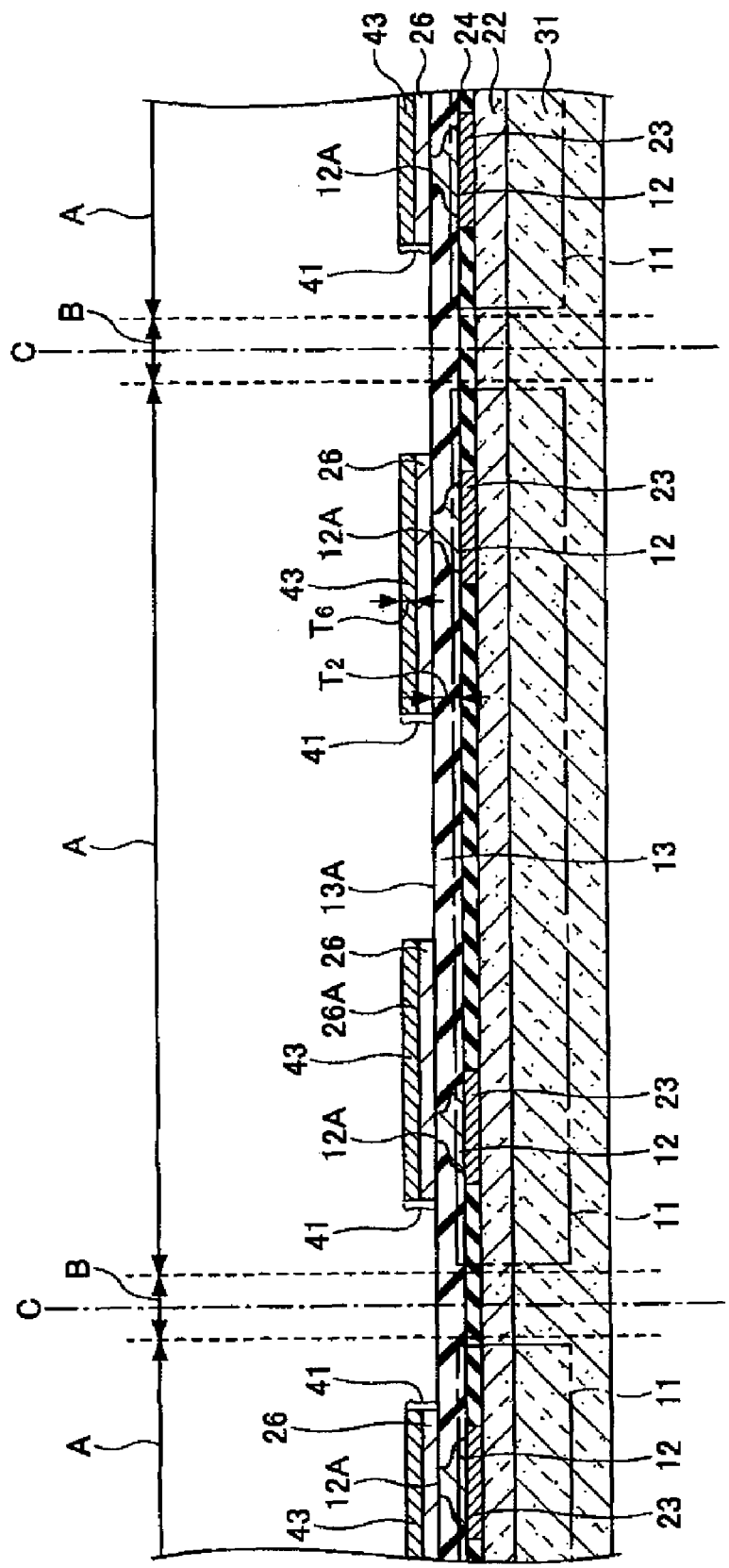
FIG. 34 is a view (No. 4) exemplifying the manufacturing process for the semiconductor device according to the second embodiment of the invention.

Then, in a step illustrated in FIG. 33, a resist film 42 illustrated in FIG. 32 is removed. Subsequently, in a step illustrated in FIG. 34, the first metal layer 26 formed on an area, on which the third metal layer 43 is not formed, is removed by etching. Thus, the wiring pattern 41 including the first metal layer 26 and the third metal layer 43 is formed.

As illustrated in FIGS. 31 to 34, the example of forming the wiring pattern 41 by a semi-additive method is described in the foregoing description of the second embodiment. Then, the semiconductor device 40 illustrated in FIG. 30 is manufactured by performing processing similar to that performed in the process illustrated in FIGS. 25 to 28 as explained in the first embodiment.

In accordance with the semiconductor device and the manufacturing method therefor according to the second embodiment of the invention, the insulating layer 13 is constructed to contain an alpha ray blocking material, e.g., modified polyimide, similarly to the semiconductor device and the manufacturing method therefor according to the first embodiment of the invention. Thus, the second embodiment can block alpha rays. Consequently, the amount of alpha rays, which are generated by the exterior or the external connection terminal 17 or the like and reach the semiconductor substrate 31, can be reduced. Accordingly, occurrence of a malfunction of the semiconductor device 40, such as what is called a soft error, can be prevented.

Further, the amount of alpha rays generated in the insulating layer 13 (i.e., the amount of detected alpha rays) itself can be reduced to, e.g., 0.0015 count/cm$^2$·h or less by adjusting the amount of inorganic filler contained in the insulating layer 13.

Moreover, the solder resist 16 itself can be prevented by using the solder resist 16, which contains no inorganic filler (i.e., is filler-less), from generating alpha rays.

Furthermore, the amount of alpha rays generated by the external connection terminal 17 (the amount of detected alpha rays) itself can be reduced using Pb-free solder, e.g., Sn-3.5Ag, or Sn-3.0Ag-0.5Cu as the material of the external connection terminal 17.

Further, the amount of alpha rays reaching the semiconductor substrate 21 can drastically be reduced by the synergy effects of the insulating layer 13, which is constructed by containing the alpha ray blocking material, e.g., modified polyimide and adjusting the amount of inorganic filler such that the amount of alpha rays detected therefrom is equal to or less than 0.0015 count/cm$^2$·h, the solder resist 16 which contains no inorganic filler (i.e., is filler-less), and the external connection terminal 17 using Pb-free solder. Occurrence of a soft error can be reduced.

Moreover, the insulating layer 13 is constructed by containing carbon black, which is a black-based material, and a black-based organic pigment or the like. Thus, the insulating layer 13 can block visible light rays and ultraviolet light rays. Thus, a malfunction of the semiconductor device 40 can be prevented from being caused due to a photoeletromotive force generated by irradiating visible light or ultraviolet light thereonto.

Furthermore, ashing is performed on the top surface 13A of the insulating layer 13. Thus, the top surface 13A of the insulating layer 13 can be roughened without complicating the manufacturing process and generating unnecessary material cost. Consequently, the manufacturing cost of the semiconductor device 40 can be restrained from increasing.

Further, the first metal layer 26 is formed by the vapor deposition method, such as a sputtering method, on each of the top surface 13A of the insulating layer 13 and the top surfaces 12A of the internal connection terminals 12. Thus, the top surfaces 12A of the internal connection terminals 12 can be strongly metal-joined with the first metal layer 26. The reliability of the mechanical and electrical connection therebetween can be enhanced.

Moreover, in a case where the first metal layer 26 is set to have a structure in which a Ti-film and a Cu-film are stacked, or a structure in which a Cr-film and a Cu-film are stacked, the thickness of the Ti-film constituting the first metal layer 26 is equal to or more than 0.05 μm and equal to or less than 2 μm, and that of the Cu-film constituting the first metal layer 26 is equal to or more than 0.2 μm and equal to or less than 1.5 μm, or the thickness of the Cr-film constituting the first metal layer 26 is equal to or more than 0.01 μm and equal to or less than 0.05 μm, and that of the Cu-film constituting the first metal layer 26 is equal to or more than 0.2 μm and equal to or less than 1.5 μm. Thus, the adhesion between the first metal layer 26 and each of the top surface 13A of the insulating layer 13 and the top surfaces 12A of the internal connection terminals 12, and between the first metal layer 26 and the third metal layer 43 can be enhanced. Subsequently, the ability to perform electrolytic plating can be favorably maintained. That is, a sheet resistance required to electrolytic plating can be assured.

Furthermore, the wiring pattern 41 is formed by the semi-additive method. Thus, the dimensional precision of the wiring pattern 41 can be enhanced. The micropatterning of the pattern can be achieved (e.g., L/S=5/5 μm).

Third Embodiment

Figure 35:
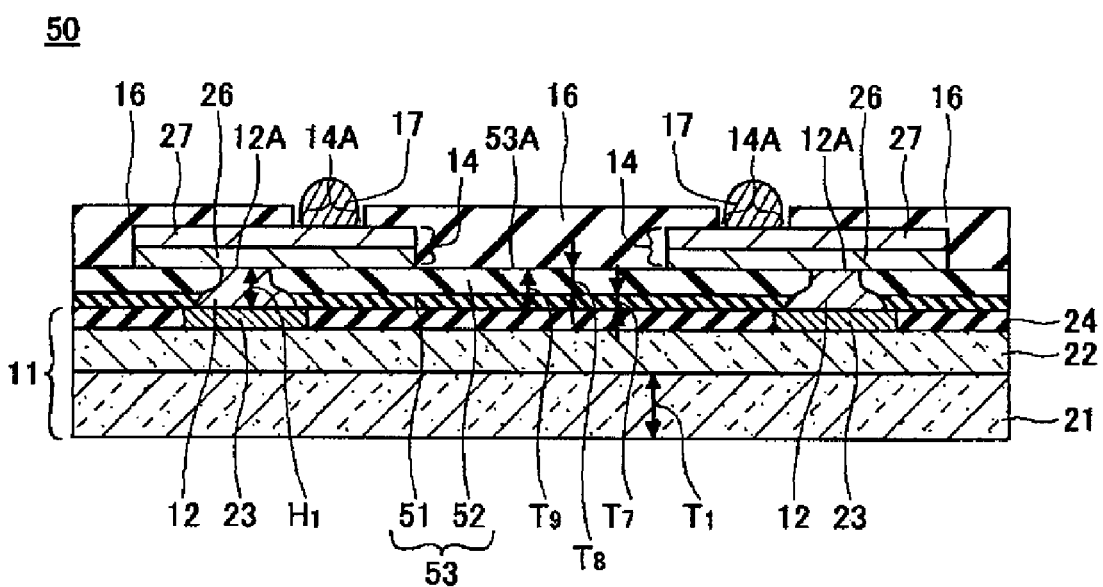
FIG. 35 is a cross-sectional view exemplifying a semiconductor device according to a third embodiment of the invention.

FIG. 35 is a cross-sectional view exemplifying a semiconductor device according to a third embodiment of the invention. In a semiconductor device 50 illustrated in FIG. 35, the same composing parts as those of the semiconductor device 10 illustrated in FIG. 12 are designated with the same reference numeral. The description of such composing parts is sometimes omitted. Referring to FIG. 35, the semiconductor device 50 according to the third embodiment is configured similarly to the semiconductor device 10 according to the first embodiment, except that an insulating layer 53 is provided instead of the insulating layer 13 provided in the semiconductor device 10 according to the first embodiment. Incidentally, reference numeral 53A designates the top surface of the insulating layer 53. Hereinafter, only differences between the semiconductor devices 50 and 10 are described.

In the semiconductor device 50 according to the third embodiment, the insulating layer 53 includes two sub-layers, i.e., a first insulating sub-layer 51 and a second insulating sub-layer 52. The thickness $T_9$ of the insulating layer 53 can be set to range from, e.g., 20 μm to 50 μm. The thickness $T_7$ of the first insulating sub-layer 51 can be set at, e.g., 10 μm. The thickness $T_8$ of the second insulating sub-layer 52 can be set at, e.g., 20 μm.

For example, a cohesive sheet-like insulating resin (e.g., NCF (non-conductive film)) put in a B-stage state (semi-cured state) or the like can be used as the materials of the first insulating sub-layer 51 and the second insulating sub-layer 52, similarly to the materials of the insulating layer 13, which have been described in the description of the first embodiment. Further, the first insulating sub-layer 51 and the second insulating sub-layer 52 are tinged with a black-based color by containing, e.g., a black-based material, such as carbon black, and a black-based organic pigment or the like, in addition to the alpha ray blocking material, such as modified polyimide. Thus, the first insulating sub-layer 51 and the second insulating sub-layer 52 have the property of blocking alpha rays and have also the property of blocking visible light rays and ultraviolet light rays.

Both the first insulating sub-layer 51 and the second insulating sub-layer 52 contain inorganic filler (however, as will be described below, sometimes, the first insulating sub-layer 51 contains no inorganic filler). The amount of alpha rays detected from the first insulating sub-layer 51 is set by the adjustment of the amount of inorganic filler contained in the first insulating sub-layer 51 to be 0.0015 count/cm²·h or less. Further, the amount of alpha rays detected from the second insulating sub-layer 52 is set by the adjustment of the amount of inorganic filler contained in the second insulating sub-layer 52 to be 0.0015 count/cm²·h or less.

Preferably, the amount of inorganic filler contained in the first insulating sub-layer 51 is set to be less than that of inorganic filler contained in the second insulating sub-layer 52. Preferably, the amount of the alpha ray blocking material, e.g., modified polyimide contained in the first insulating sub-layer 51 is set to be larger than that of the alpha ray blocking material, e.g., modified polyimide contained in the second insulating sub-layer 52. This is because the amount of alpha rays reaching the semiconductor substrate 21 can be reduced as much as possible by setting the first insulating sub-layer 51, which is closer to the semiconductor substrate 21, in this manner.

An amount of inorganic filler contained in the first insulating sub-layer 51 can be set to range from, e.g., 0 to 20 wt % (i.e., a ratio of the weight of the inorganic filler to the weight of the first insulating sub-layer 51). An amount of inorganic filler contained in the second insulating sub-layer 52 can be set to range from, e.g., 30 to 50 wt % (i.e., a ratio of the weight of the inorganic filler to the weight of the second insulating sub-layer 52). Incidentally, in order to achieve objects, such as reduction in the coefficient of the thermal expansion, and reduction of the warpage of the Si wafer due to a mismatch in the coefficient of thermal expansion between the insulating sub-layers, both of the amount of inorganic filler contained in the first insulating sub-layer 51 and the amount of inorganic filler contained in the second insulating sub-layer 52 cannot be set to zero. However, the amount of the inorganic filler contained in the first insulating sub-layer 51 can be set to be zero. Consequently, the amount of alpha rays reaching the semiconductor substrate 21 can drastically be reduced. The object, such as the reduction in the coefficient of thermal expansion, can be achieved by adjusting the inorganic filler contained in the second insulating sub-layer 52.

The semiconductor device 50 according to the third embodiment of the invention can be manufactured by a manufacturing method which is similar to the manufacturing method for manufacturing the semiconductor device 10 according to the first embodiment of the invention and is similar also to that for manufacturing the semiconductor device 40 according to the second embodiment of the invention. Thus, the description of the manufacturing method according to the third embodiment is omitted.

The semiconductor device according to the third embodiment of the invention can obtain advantages similar to those of the semiconductor device according to the first embodiment and to those of the semiconductor device according to the second embodiment. Further, the amount of alpha rays reaching the semiconductor substrate 21 can drastically be decreased by constructing the insulating layer 53 to include two sub-layers, i.e., the first insulating sub-layer 51 and the second insulating sub-layer 52 and by setting the amount of inorganic filler contained in the first insulating sub-layer 51, which is provided closer to the semiconductor substrate 21, at a small value (including zero) and increasing an amount of polyimide contained in the first insulating sub-layer.

Incidentally, the insulating layer 53 can be constructed to have three or more sub-layers. In this case, the amount of alpha rays reaching the semiconductor substrate 21 can drastically be decreased by setting the amount of inorganic filler contained in a sub-layer, which is provided closer to the semiconductor substrate 21, at a small value (including zero) and by increasing an amount of polyimide contained in this sub-layer.

Although preferred embodiments of the invention have been described in detail in the foregoing description, the invention is not limited thereto. Various modifications and substitutions can be added to the embodiments without departing from the scope of the invention.

For example, in the description of the step illustrated in FIG. 14, an example using the semiconductor substrate 21 has been described, which has a plurality of semiconductor device formation areas A and the scribe area B including the substrate cutting positions C for separating the plurality of semiconductor device formation areas A. However, the semiconductor chips do not always have to be formed on the semiconductor substrate. The apparatus according to the invention can be constructed such that one semiconductor chip is formed on a single semiconductor substrate.

What is claimed is:

1. A semiconductor device comprising:
a semiconductor substrate on which a semiconductor integrated circuit having an electrode pad is formed,
an internal connection terminal provided on the electrode pad,
an insulating layer provided to cover the semiconductor integrated circuit and the internal connection terminal, and
a wiring pattern connected to the internal connection terminal across the insulating layer, wherein
the insulating layer comprises a first insulating layer and a second insulating layer formed above the first insulating layer,
the first and second insulating layers comprise polyimide and/or a polyimide-based compound and a material blocking visible light and ultraviolet light,
at least the second insulating layer comprises an inorganic filler,
an amount of the polyimide and/or a polyimide-based compound contained in the first insulating layer is larger than an amount of the polyimide and/or a polyimide-based compound contained in the second insulating layer, and
an amount of the inorganic filler is adjusted such that an amount of alpha rays detected from the insulating layer is equal to or less than 0.0015 count/cm$^2$·h.

2. The semiconductor device according to claim 1, wherein an amount of an inorganic filler contained in the first insulating layer, is less than an amount of the inorganic filler contained in the second insulating layer.

3. The semiconductor device according to claim 2, wherein the first insulating layer contains no inorganic filler.

4. The semiconductor device according to claim 1, wherein the material blocking visible light and ultraviolet light is a black-based material.

5. The semiconductor device according to claim 4, wherein the black-based material is carbon black.

6. The semiconductor device according to claim 4, wherein the black-based material is an organic pigment.

7. The semiconductor device according to claim 1, wherein an amount of each of ionic impurities $Cl^-$ and $Na^+$ contained in the insulating layer is 10 part per million (ppm) or less.

8. The semiconductor device according to claim 1, wherein an amount of an ionic impurity $NH_4^+$ contained in the insulating layer is 50 ppm or less.

9. The semiconductor device according to claim 1, wherein the wiring pattern includes a structure in which a titanium film and a copper film are stacked.

10. The semiconductor device according to claim 9, wherein the titanium film is metal-joined with the copper film and the internal connection terminal.

11. The semiconductor device according to claim 1, wherein a surface of the insulating layer is roughened.

12. The semiconductor device according to claim 1, wherein
a solder resist layer is formed on the insulating layer to cover the wiring pattern, and
the solder resist layer contains no inorganic filler.

13. The semiconductor device according to claim 1, wherein
the solder resist layer has an opening into which the wiring pattern is exposed,
an external connection terminal is formed on the wiring pattern to be exposed into the opening portion, and
a material of the external connection terminal does not contain Pb.

* * * * *